(12) United States Patent
Ogawa et al.

(10) Patent No.: US 11,296,251 B2
(45) Date of Patent: Apr. 5, 2022

(54) ELECTROMAGNETIC WAVE DETECTOR AND ELECTROMAGNETIC WAVE DETECTOR ARRAY INCLUDING THE SAME

(71) Applicant: Mitsubishi Electric Corporation, Chiyoda-ku (JP)

(72) Inventors: Shimpei Ogawa, Chiyoda-ku (JP); Masaaki Shimatani, Chiyoda-ku (JP); Shoichiro Fukushima, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/960,215

(22) PCT Filed: Aug. 28, 2018

(86) PCT No.: PCT/JP2018/031723
§ 371 (c)(1),
(2) Date: Jul. 6, 2020

(87) PCT Pub. No.: WO2019/171622
PCT Pub. Date: Sep. 12, 2019

(65) Prior Publication Data
US 2020/0395499 A1  Dec. 17, 2020

(30) Foreign Application Priority Data
Mar. 6, 2018  (JP) ............................ JP2018-039574

(51) Int. Cl.
*H01L 31/062* (2012.01)
*H01L 31/113* (2006.01)
(Continued)

(52) U.S. Cl.
CPC ........ *H01L 31/113* (2013.01); *H01L 31/0288* (2013.01); *H01L 31/022408* (2013.01)

(58) Field of Classification Search
CPC .......... H01L 31/113; H01L 31/022408; H01L 31/0288
(Continued)

(56) References Cited

U.S. PATENT DOCUMENTS

2011/0042650 A1   2/2011  Avouris et al.
2014/0264275 A1*  9/2014  Zhong ............. H01L 31/035218
                                              257/21

(Continued)

FOREIGN PATENT DOCUMENTS

JP       2013-502735 A      1/2013
WO    WO 2018/012076 A1    1/2018

OTHER PUBLICATIONS

International Search Report dated Nov. 13, 2018 in PCT/JP2018/031723 filed Aug. 28, 2018, 2 pages.
(Continued)

*Primary Examiner* — Calvin Y Choi
(74) *Attorney, Agent, or Firm* — Xsensus LLP

(57) ABSTRACT

An electromagnetic wave detector includes: an insulating film having a first surface and a second surface facing the first surface; a first layer to perform photoelectric conversion by an incident electromagnetic wave and change in potential, the first layer being made of a first two-dimensional atomic layer material; and a second layer to receive the change in potential through the first insulating film and generate change in electrical quantity, the second layer being made of a second two-dimensional atomic layer material and provided on the first surface. In this manner, the sensitive electromagnetic wave detector detecting an incident electromagnetic wave as change in electrical quantity and having high response speed to an incident electromagnetic wave can be provided.

17 Claims, 13 Drawing Sheets

(51) Int. Cl.
*H01L 31/0224* (2006.01)
*H01L 31/0288* (2006.01)

(58) Field of Classification Search
USPC .......................................................... 257/290
See application file for complete search history.

(56) References Cited

U.S. PATENT DOCUMENTS

2015/0243826 A1    8/2015  An et al.
2020/0052146 A1*   2/2020  Ogawa .................. G01J 5/0881

OTHER PUBLICATIONS

Wang et al., "Two dimensional materials based photodetectors", Infrared Physics & Technology, 2017, vol. 88, pp. 149-173, 26 total pages.
Liu et al., "Graphene photodetectors with ultra-broadband and high responsivity at room temperature", nature nanotechnology, Letters, 2014, vol. 9, pp. 273-278 (8 total pages).
Zhang et al., "Electrically Tunable Photoresponse in a Graphene Heterostructure Photodetector", 2017 Conference on Lasers and Electro-Optics (CLEO), 2017, 3 total gages.
Extended European search report dated Nov. 4, 2020, in corresponding European patent Application No. 18908816.4, 8 pages.

* cited by examiner

ELECTROMAGNETIC WAVE DETECTOR AND ELECTROMAGNETIC WAVE DETECTOR ARRAY INCLUDING THE SAME

TECHNICAL FIELD

The present invention relates to an electromagnetic wave detector and an electromagnetic wave detector array including the same.

BACKGROUND ART

As a material for an electromagnetic wave detection layer used for a next generation electromagnetic wave detector, graphene having a zero or very small band gap is receiving increasing attention.

For example, there has been proposed an electromagnetic wave detector in which an insulating film is provided on a semiconductor substrate, a channel layer formed of a graphene layer is formed on the insulating film, and source and drain electrodes are formed at opposite ends of the graphene layer (see PTL 1, for example).

There has also been proposed an electromagnetic wave detector in which a graphene layer is provided on a semiconductor substrate with an insulating film interposed therebetween, and furthermore, a ferroelectric layer having a polarization effect by electromagnetic waves is provided between the graphene layer and the insulating film (see PTL 2, for example).

CITATION LIST

Patent Literature

PTL 1: Japanese National Patent Publication No. 2013-502735
PTL 2: WO 2018/012076

SUMMARY OF INVENTION

Technical Problem

A conventional electromagnetic wave detector formed of a single layer of graphene can detect a broad wavelength region of electromagnetic waves by using graphene. Unfortunately, however, graphene has very low photoelectric conversion efficiency, such as a few percent, for electromagnetic waves, and therefore has low sensitivity for detecting electromagnetic waves.

A conventional electromagnetic wave detector using a ferroelectric layer can have enhanced sensitivity for detecting electromagnetic waves as compared to the conventional electromagnetic wave detector formed of a single layer of graphene. Unfortunately, however, a ferroelectric layer has low response speed to electromagnetic waves, and is therefore not suitable for an electromagnetic wave detector required to have high detection speed to electromagnetic waves.

Thus, the present invention has been made to solve such problems with the conventional techniques, and has an object to provide a sensitive electromagnetic wave detector having high response speed to electromagnetic waves, and an electromagnetic wave detector array including the same.

Solution to Problem

To achieve the object, an electromagnetic wave detector of the present invention includes: a first insulating film having a first surface and a second surface facing the first surface; a first layer to perform photoelectric conversion by an incident electromagnetic wave and change in potential, the first layer being made of a first two-dimensional atomic layer material; and a second layer to receive the change in potential through the first insulating film and generate change in electrical quantity, the second layer being made of a second two-dimensional atomic layer material and provided on the first surface.

Advantageous Effects of Invention

The electromagnetic wave detector of the present invention configured as described above and an electromagnetic wave detector array including the same can detect an incident electromagnetic wave as change in electrical quantity, to provide a sensitive electromagnetic wave detector having high response speed to an incident electromagnetic wave, and an electromagnetic wave detector array including the same.

DESCRIPTION OF EMBODIMENTS

Figure 1:
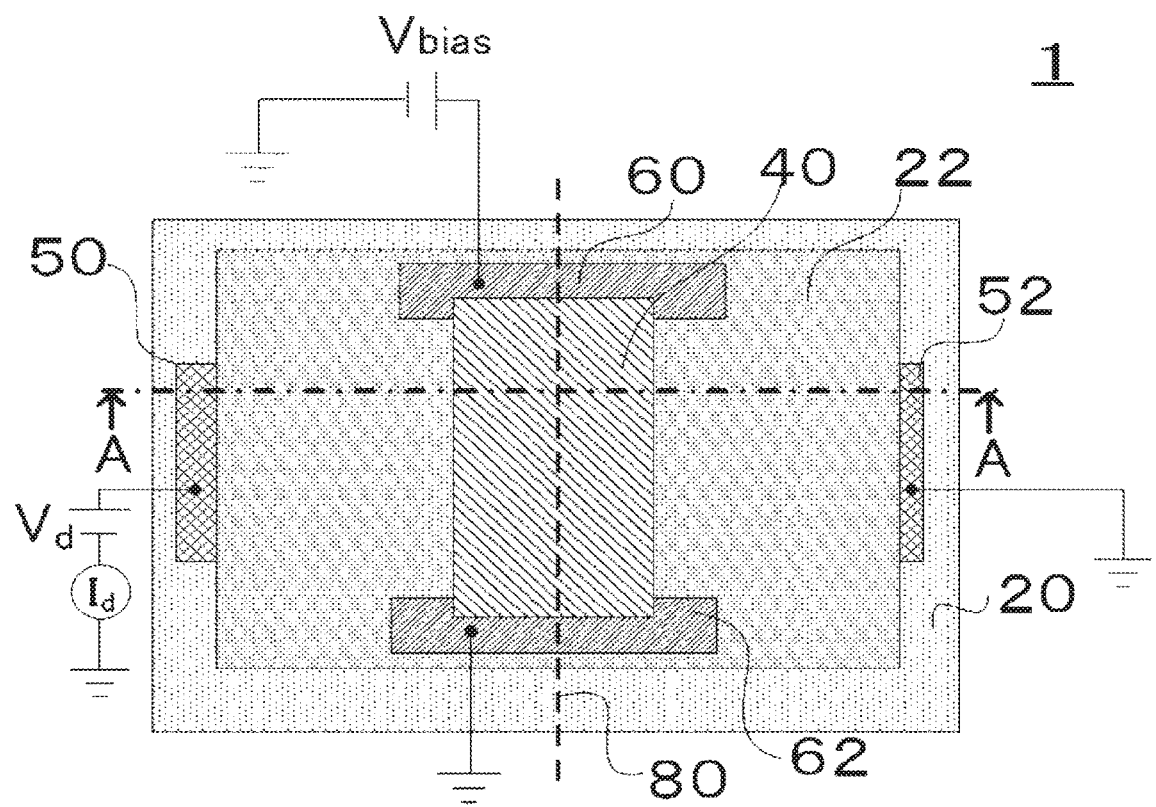
FIG. 1 is a plan view showing the configuration of an electromagnetic wave detector in Embodiment 1 of the present invention.

First, the configuration of an electromagnetic wave detector of the present invention will be described with reference to the drawings. Note that the drawings are schematic only, and intended to conceptually illustrate functions or structures. In addition, the present invention is not limited to embodiments described below. A basic configuration of the electromagnetic wave detector is the same for all embodiments unless otherwise specified. Identical reference numerals denote the same or corresponding elements throughout the text of the specification.

While the electromagnetic wave detector will be described using visible light or infrared light in the embodiments of the present invention, the present invention is also effective as detectors for, in addition to these lights, radio wave regions such as X-rays, ultraviolet light, near-infrared light, terahertz (THz) waves, and microwaves. Note that these lights and radio waves will be collectively referred to as electromagnetic waves in the embodiments of the present invention.

In addition, while the electromagnetic wave detector will be described using a graphene layer having graphene which is a two-dimensional atomic layer material in the embodiments of the present invention, the present invention is also applicable to an electromagnetic wave detector having a layer made of a two-dimensional atomic layer material such as graphene nanoribbon, transition metal dichalcogenide such as $MoS_2$, $WS_2$, $WSe_2$, black phosphorus, silicene, or germanene.

In addition, while the electromagnetic wave detector will be described using a structure having two source and drain electrodes, and a structure further having a backside electrode serving as a back gate in the embodiments of the present invention, the present invention is also applicable to an electromagnetic wave detector having another electrode structure such as a four-terminal electrode structure or a top gate structure.

In addition, a plasmon resonance phenomenon such as a surface plasmon resonance phenomenon effected by interaction between a metal surface and light; a phenomenon called pseudo-surface plasmon resonance in the sense of resonance on a metal surface in regions other than the visible light region/near-infrared light region; or a phenomenon called metamaterial or plasmonic metamaterial in the sense of operating a specific wavelength by means of a structure having a dimension less than or equal to a wavelength are not particularly distinguished from one another by name, and are considered equivalent in terms of effects produced by the phenomena. These resonances are herein referred to as surface plasmon resonance, plasmon resonance, or simply resonance.

Embodiment 1

Figure 2:
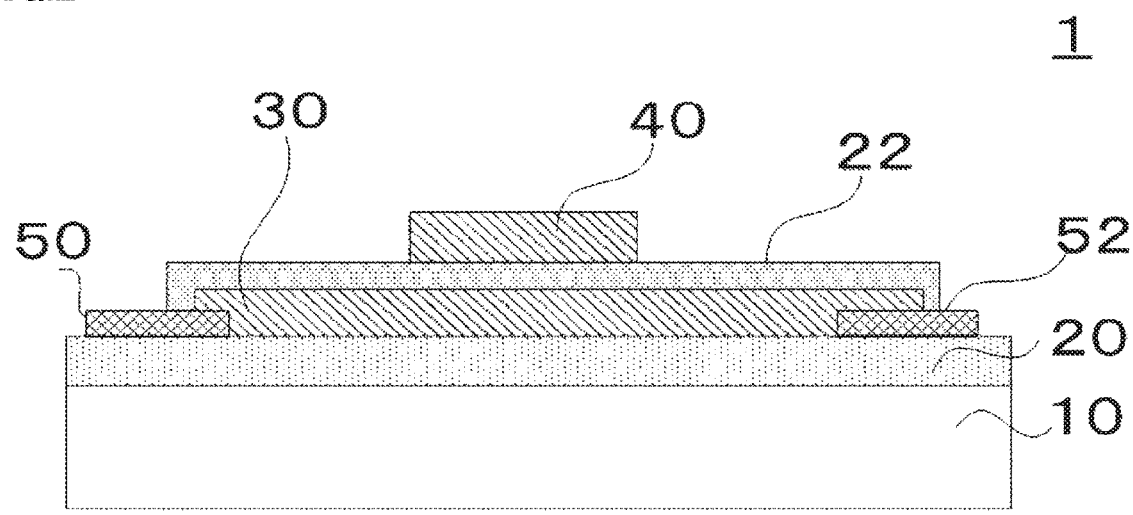
FIG. 2 is a sectional view showing the configuration of the electromagnetic wave detector in Embodiment 1 of the present invention.

FIG. 1 is a plan view showing the configuration of an electromagnetic wave detector in the present embodiment. FIG. 2 is a sectional view showing the configuration of the electromagnetic wave detector in the present embodiment, as seen along the section line A-A in FIG. 1.

Referring to FIGS. 1 and 2, the configuration of an electromagnetic wave detector 1 in the present embodiment is described.

Electromagnetic wave detector 1 in the present embodiment includes a substrate 10, an insulating film 20 provided on substrate 10, a graphene layer 30 provided on insulating film 20, an insulating film 22 provided on graphene layer 30, and a graphene layer 40 provided on insulating film 22.

Electromagnetic wave detector 1 also includes a drain electrode 50 electrically connected to one end of graphene layer 30, and a source electrode 52 electrically connected to the other end of graphene layer 30. Drain electrode 50 and source electrode 52 are provided on insulating film 20 such that they are partially covered with graphene layer 30. Drain electrode 50 is electrically connected to a power supply circuit in order to apply a voltage $V_d$ to graphene layer 30, and source electrode 52 is grounded. The power supply circuit connected to drain electrode 50 is connected to an ammeter for detecting a current $I_d$ in graphene layer 30 between drain electrode 50 and source electrode 52.

Electromagnetic wave detector 1 also includes an electrode 60 electrically connected to one end of graphene layer 40, and an electrode 62 electrically connected to the other end of graphene layer 40. Electrode 60 is connected to a power supply circuit that applies a bias voltage $V_{bias}$, and electrode 62 is grounded. Bias voltage $V_{bias}$ is thereby applied to graphene layer 40.

Substrate 10 has a front surface, and a back surface facing and parallel to the front surface, is made of a semiconductor material such as silicon, and is specifically a high-resistance silicon substrate, a substrate with increased insulation by the formation of a thermal oxide film, a silicon substrate doped with an impurity, or the like.

As shown in FIG. 2, insulating film 20 is provided on the front surface of substrate 10, and can be, for example, an insulating film made of silicon oxide.

As shown in FIG. 2, graphene layer 30 is provided on a surface of insulating film 20 opposite to the surface on which substrate 10 is provided. Graphene layer 30 can be, for example, a monolayer of graphene. A monolayer of graphene is a monoatomic layer of two-dimensional carbon crystal, and a monolayer of graphene has a thickness of 0.34 nm corresponding to one carbon atom. Graphene has carbon atoms in each of hexagonally arranged chains.

As shown in FIG. 2, insulating film 22 has an upper surface and a lower surface, is provided on graphene layer 30 to contact graphene layer 30 at the lower surface, and can be, for example, an insulating film made of silicon oxide.

Graphene layer 40 is provided on insulating film 22 to contact the upper surface of insulating film 22, and bias voltage $V_{bias}$ is applied to graphene layer 40 from electrode 60, as shown in FIG. 1. As with graphene layer 30, graphene layer 40 can be, for example, a monolayer of graphene.

Drain electrode 50 and source electrode 52 are electrically connected to graphene layer 30, and provided on insulating film 20 such that they are partially covered with graphene layer 30. Drain electrode 50 and source electrode 52 are made of metal such as Au.

As described above, voltage $V_d$ is applied between drain electrode 50 and source electrode 52, and an electromagnetic wave can be detected by detection of change in current $I_d$ in graphene layer 30 between drain electrode 50 and source electrode 52.

Electrode 60 and electrode 62 apply bias voltage $V_{bias}$ to graphene layer 40 as described above, and are made of metal such as Au.

As stated above, electromagnetic wave detector 1 in the present embodiment is configured.

The operating principle of electromagnetic wave detector 1 in the present embodiment is now described.

As described above, electromagnetic wave detector 1 in the present embodiment includes substrate 10, insulating film 20 provided on substrate 10, graphene layer 30 provided on insulating film 20, insulating film 22 provided on graphene layer 30, and graphene layer 40 provided on insulating film 22. The electromagnetic wave detector also includes drain electrode 50 electrically connected to one end of graphene layer 30 and source electrode 52 electrically connected to the other end of graphene layer 30, voltage $V_d$ is applied between drain electrode 50 and source electrode 52, and change in current $I_d$ in graphene layer 30 between drain electrode 50 and source electrode 52 is detected. The electromagnetic wave detector further includes electrode 60 electrically connected to one end of graphene layer 40 and electrode 62 electrically connected to the other end of graphene layer 40, and bias voltage $V_{bias}$ is applied to electrode 60.

Thus, electromagnetic wave detector 1 in the present embodiment functions as a graphene transistor having graphene layer 40 to which bias voltage $V_{bias}$ is applied as a gate electrode, and graphene layer 30 as a channel layer. When bias voltage $V_{bias}$ is applied to graphene layer 40, therefore, a gate voltage is applied to graphene layer 30 through insulating film 22, causing current $I_d$ to flow in graphene layer 30 between drain electrode 50 and source electrode 52 where voltage $V_d$ is applied.

Figure 3:
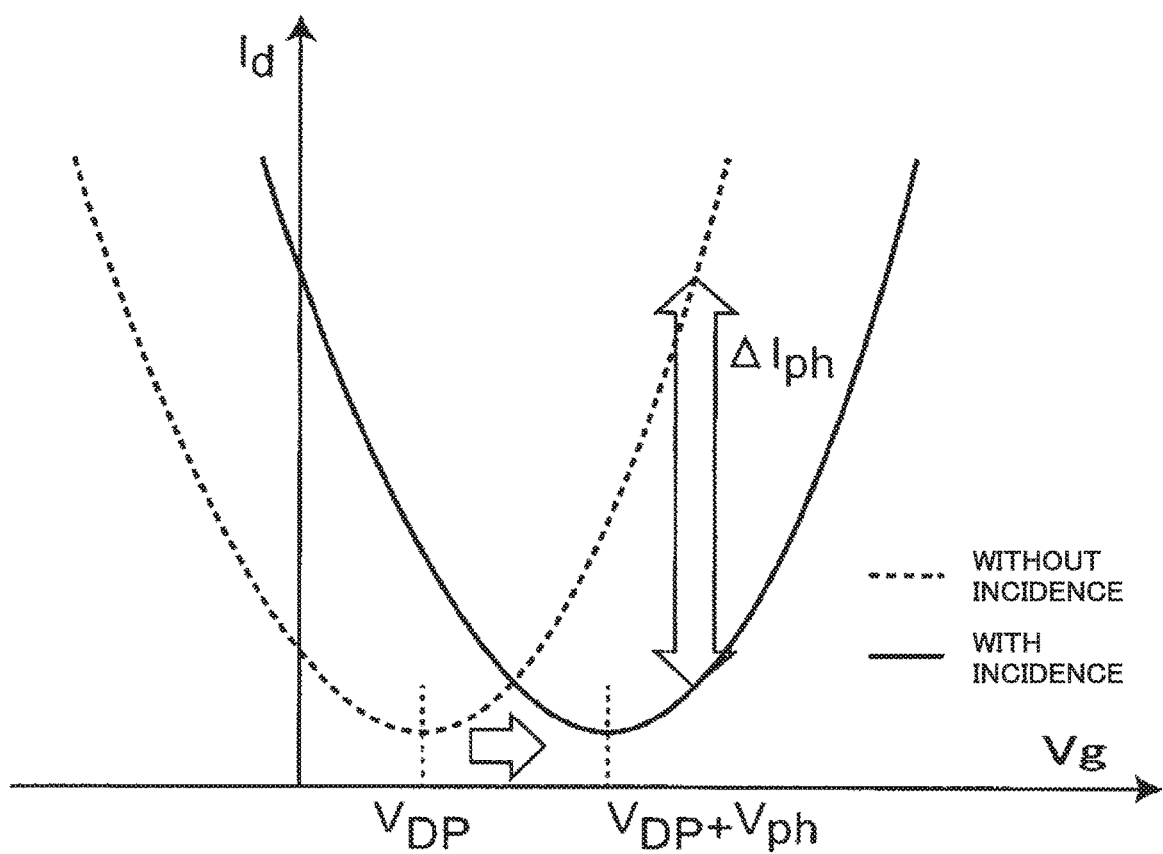
FIG. 3 illustrates the operating principle of the electromagnetic wave detector in Embodiment 1 of the present invention.

FIG. 3 illustrates the operating principle of electromagnetic wave detector 1 in the present embodiment, showing relation between a gate voltage $V_g$ applied to graphene layer 40 and current $I_d$ flowing in graphene layer 30 in electromagnetic wave detector 1 in the present embodiment.

When an electromagnetic wave is not incident on graphene layer 40, electromagnetic wave detector 1 in the present embodiment exhibits a characteristic of gate voltage $V_g$—current $I_d$ as indicated by a broken line in FIG. 3, in a curve indicating bipolar transistor operation in normal graphene. Gate voltage $V_g$ that provides a Dirac point is represented by $V_{DP}$.

When an electromagnetic wave is incident on graphene layer 40, on the other hand, graphene layer 40 performs photoelectric conversion, graphene layer 40 to which bias voltage $V_{bias}$ is applied changes in potential, and the gate voltage applied to graphene layer 30 changes. When the change in the gate voltage due to the change in the potential of graphene layer 40 is represented by $V_{ph}$, the characteristic of gate voltage $V_g$—current $I_d$ when an electromagnetic wave is incident on graphene layer 40 draws a curve as indicated by a solid line in FIG. 3, with the gate voltage that provides the Dirac point shifted from $V_{DP}$ to $V_{DP}+V_{ph}$.

That is, when an electromagnetic wave is incident on graphene layer 40, the characteristic of gate voltage $V_g$—current $I_d$ is shifted from the curve indicated by the broken line in FIG. 3 to the curve indicated by the solid line in FIG. 3, causing generation of a differential current of $\Delta I_{ph}$, which is change in electrical quantity associated with the change in the potential of graphene layer 40, in graphene layer 30 between drain electrode 50 and source electrode 52. Such effect is referred to as an optical gate effect or an optical switch. By detecting this differential current $\Delta I_{ph}$ which is the change in electrical quantity, the incidence of an electromagnetic wave can be detected.

When made of a monolayer of graphene, graphene layer 30 is a thin film having a thickness of one atomic layer, and has high electron mobility. Accordingly, large current change occurs in response to slight potential change, as compared to a normal semiconductor. For example, current change $\Delta I_{ph}$ in response to the potential change in graphene layer 30 due to change $V_{ph}$ in the gate voltage is several hundred to several thousand times larger than that of a normal semiconductor, when calculated from electron mobility and film thickness.

By utilizing the optical gate effect, therefore, the efficiency of extracting a detection current in graphene layer 30 is significantly increased, as compared to the low photoelectric conversion efficiency of graphene. Such optical gate effect increases current change due to the incidence of an electromagnetic wave, rather than directly augmenting quantum efficiency of a photoelectric conversion material. Thus, the quantum efficiency equivalently calculated from a differential current due to the incidence of an electromagnetic wave can exceed 100%. Accordingly, a sensitive electromagnetic wave detector can be obtained as compared to a conventional electromagnetic wave detector.

In addition to the differential current described above, a photocurrent is also generated due to the original photoelectric conversion efficiency of graphene. In graphene layer 30, therefore, by the incidence of an electromagnetic wave, the photocurrent generated due to the original photoelectric conversion efficiency of graphene can be detected, in addition to the differential current associated with the optical gate effect described above.

In addition, in electromagnetic wave detector 1 in the present embodiment, the differential current is generated in graphene layer 30 due to the change in the gate voltage of graphene layer 40 associated with the incidence of the electromagnetic wave. Graphene layer 40 is made of graphene and has higher electron mobility than a semiconductor, and can therefore transmit to graphene layer 30, at high response speed, the gate voltage change caused by the potential change in graphene layer 40 associated with the incidence of the electromagnetic wave. Accordingly, the differential current generated in graphene layer 30 can be detected more quickly, so that electromagnetic wave detector 1 in the present embodiment can have increased response speed to electromagnetic waves.

In addition, since graphene has sensitivity to photoelectric conversion for a broad wavelength region of electromagnetic waves, graphene layer 40 generates change in the gate voltage for a broad wavelength region of electromagnetic waves. In graphene layer 30, therefore, a differential current is generated for a broad wavelength region of electromagnetic waves. Accordingly, electromagnetic wave detector 1 in the present embodiment can detect, for example, electromagnetic waves in a broad wavelength region from ultraviolet light to radio waves.

In addition, in electromagnetic wave detector 1 in the present embodiment, graphene layer 40 is provided partially above graphene layer 30 between drain electrode 50 and source electrode 52. That is, above graphene layer 30, there are a region where graphene layer 40 is provided with insulating film 22 interposed therebetween, and a region where graphene layer 40 is not provided. For this reason, the gate voltage applied to graphene layer 30 varies between the regions where graphene layer 40 is provided and graphene layer 40 is not provided, causing a difference in Fermi level in graphene layer 30. That is, a potential gradient is generated between the regions in graphene layer 30 where graphene layer 40 is provided and graphene layer 40 is not provided, to form a pseudo PNP junction or NPN junction.

In graphene, since it has bipolar transistor characteristics as described above, the Fermi level can be adjusted by a gate voltage, and either electrons or holes can be selected as majority carriers, to equivalently achieve N type or P type conductivity. That is, when a gate voltage is applied from graphene layer 40 to graphene layer 30, different gate voltages will be applied between the regions in graphene layer 30 where graphene layer 40 is provided and graphene layer 40 is not provided. Thus, regions of different carrier densities are formed between the regions in graphene layer 30 where graphene layer 40 is provided and graphene layer 40 is not provided, causing formation of a potential gradient of a pseudo PNP junction or NPN junction in graphene layer 30. Such formation of the potential gradient of the pseudo PNP junction or NPN junction can improve the efficiency of extracting the detection current in graphene layer 30, thereby enhancing the sensitivity of electromagnetic wave detector 1 in the present embodiment to electromagnetic waves.

As stated above, the electromagnetic wave detector in the present embodiment configured as described above can detect electromagnetic waves in a broad wavelength region, to provide a sensitive electromagnetic wave detector having high response speed to electromagnetic waves.

While substrate 10 has been described as a silicon substrate by way of example, substrate 10 may be a substrate containing germanium, a compound semiconductor such as a III-V group or II-V group semiconductor, mercury cadmium telluride, indium antimony, lead selenium, lead sulfur, cadmium sulfur, gallium nitrogen, silicon carbide, or a quantum well or a quantum dot, or a substrate containing a material such as a Type II superlattice alone or in combination.

While insulating film 20 and insulating film 22 have each been described as an insulating film made of silicon oxide by way of example, the insulating films may be an insulating film made of silicon nitride, hafnium oxide, aluminum oxide, nickel oxide, boron nitride or the like. Boron nitride, for example, is similar to graphene in atomic arrangement, and therefore does not hinder charge mobility even when in contact with graphene. Thus, boron nitride does not inhibit the performance of graphene such as electron mobility, and is a preferable underlying film of graphene.

Graphene layer 30 and graphene layer 40 may be formed of multiple layers of graphene including two or more laminated layers. Alternatively, graphene layer 30 and graphene layer 40 may be made of non-doped graphene, or graphene doped with a p type or n type impurity.

If graphene layer 30 and graphene layer 40 are formed of multiple layers of graphene, the photoelectric conversion efficiency of graphene layer 30 and graphene layer 40 is increased, and the sensitivity of the electromagnetic wave detector is enhanced. In the multiple layers of graphene, the orientations of lattice vectors of hexagonal lattices of any two layers of graphene may not be matched with each other, or may be completely matched with each other. By laminating two or more layers of graphene, for example, a band gap is formed in graphene layer 30 and graphene layer 40, so that the effect of selecting a wavelength of an electromagnetic wave to be subjected to photoelectric conversion can be provided.

In addition, graphene layer 30 and graphene layer 40 may be made of graphene in the form of a nanoribbon. In this case, graphene layer 30 and graphene layer 40 can have a single graphene nanoribbon, a structure in which a plurality of graphene nanoribbons are laminated, or a structure in which graphene nanoribbons are periodically arranged on a plane. In the case of the structure in which graphene nanoribbons are periodically arranged, for example, plasmon resonance can be generated in the graphene nanoribbons, to improve the sensitivity of the electromagnetic wave detector. The structure in which graphene nanoribbons are periodically arranged is also referred to as graphene metamaterial, but generates the same phenomenon.

While graphene layer 40 has been described as being provided on a part of graphene layer 30 with insulating film 22 interposed therebetween by way of example, graphene layer 40 is not necessarily limited to this configuration, and may be provided on the entire graphene layer 30 with the insulating film interposed therebetween.

Drain electrode 50 and source electrode 52 are not limited to the configuration described above. For example, drain electrode 50 and source electrode 52 may be provided on graphene layer 30.

In addition, drain electrode 50 and source electrode 52 may be made of metal such as Ag, Cu, Al, Ni, Cr or Pd, and an adhesion film (not shown) made of Cr or Ti may be formed between drain electrode 50 and insulating film 20, or between source electrode 52 and insulating film 20. Drain electrode 50 and source electrode 52 are not particularly limited in shape so long as they have a size and a thickness allowing output of an electric signal.

In addition, the configuration described above is not restrictive. For example, a constant current may be passed between drain electrode 50 and source electrode 52 to detect a voltage value of graphene layer 30 between drain electrode 50 and source electrode 52, or only one of drain electrode 50 and source electrode 52 may be formed and potential change in graphene layer 30 may be detected. Any configuration capable of detecting change in electrical quantity in graphene layer 30 may be used.

While a configuration in which two electrode 60 and electrode 62 are provided has been described by way of example in the present embodiment, this is not restrictive. For example, one electrode may be connected or a plurality of electrodes may be connected to graphene layer 40, so long as bias voltage $V_{bias}$ is applied to graphene layer 40, a gate voltage or gate current is applied to graphene layer 30, and potential change in graphene layer 40 is provided to graphene layer 30. Any circuit configuration may be used so long as a potential is provided to graphene layer 40, and potential change in graphene layer 40 is provided to graphene layer 30 through insulating film 22, without being limited to the circuit configuration described above.

In addition, electrode 60 and electrode 62 may be made of metal such as Ag, Cu, Al, Ni, Cr or Pd, and an adhesion film (not shown) made of Cr or Ti may be formed between electrode 60 and insulating film 22, and between electrode 62 and insulating film 22. Electrode 60 and electrode 62 are not particularly limited in shape so long as they have a size and a thickness allowing output of an electric signal.

In addition, electrode 60 and electrode 62 should only be electrically connected to graphene layer 40, and may be provided either on graphene layer 40 or on insulating film 22.

While graphene layer 40 is used as a gate electrode and the gate voltage is applied to graphene layer 30 in electromagnetic wave detector 1 in the present embodiment, the configuration may be such that graphene layer 30 is used as a gate electrode and the gate voltage is applied to graphene layer 40. In this case, the power supply circuit and the like connected to electrode 60 and electrode 62 are connected to drain electrode 50 and source electrode 52, and the power supply circuit and the like connected to drain electrode 50 and source electrode 52 are connected to electrode 60 and electrode 62. Here, the thickness of insulating film 22 may be set such that an incident electromagnetic wave passes through insulating film 22 and reaches graphene layer 30. It is also desirable to set the thickness of insulating layer 22 such that a tunnel current is not generated.

Figure 4:
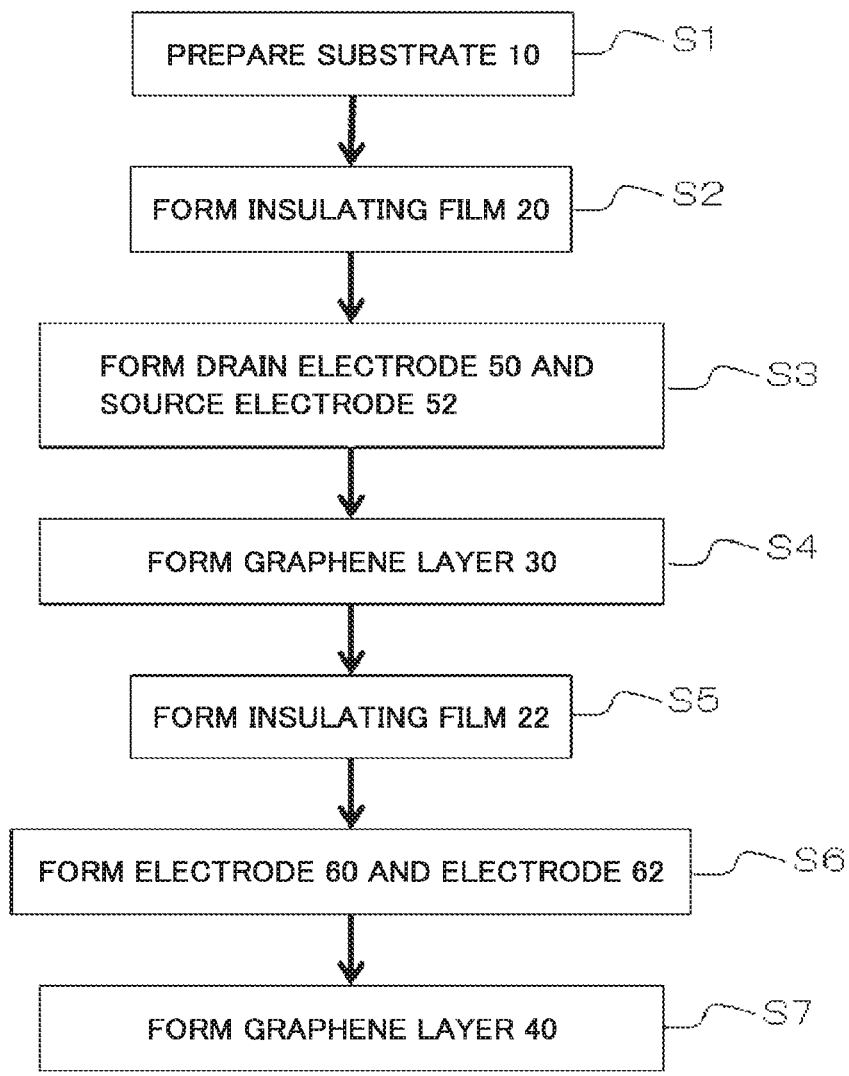
FIG. 4 is a flow diagram showing steps of manufacturing the electromagnetic wave detector in Embodiment 1 of the present invention.

A method of manufacturing electromagnetic wave detector 1 in the present embodiment is now described. FIG. 4 is a flow diagram showing steps of manufacturing electromagnetic wave detector 1 in the present embodiment.

First, substrate 10 having the front surface and the back surface facing and parallel to the front surface, and formed of a silicon substrate, for example, is prepared (S1).

Next, insulating film 20 is formed on substrate 10 (S2). If substrate 10 is a silicon substrate, for example, insulating film 20 may be a silicon oxide film formed by thermal oxidation, or another insulating film formed using chemical vapor deposition (CVD) or sputtering.

Next, drain electrode 50 and source electrode 52 are formed on insulating film 20 (S3). Drain electrode 50 and source electrode 52 can be formed by forming a resist mask having an opening over insulating film 20 using photolithography, EB drawing or the like, and then depositing a metal film made of Au or the like using EB vapor deposition, sputtering vapor deposition or the like, followed by liftoff. When forming drain electrode 50 and source electrode 52, an adhesion film made of Cr, Ti or the like may be formed between drain electrode 50 and insulating film 20, or between source electrode 52 and insulating film 20, in order to improve the adhesion to underlying insulating film 20.

Then, graphene layer 30 is formed on insulating film 20, drain electrode 50 and source electrode 52 by being selectively grown by epitaxial growth (S4). Other than being formed by epitaxial growth that allows selective growth, graphene layer 30 may be formed by forming a film of graphene with a method of transferring and affixing graphene formed using CVD, or with a method of transferring and affixing graphene exfoliated from graphite due to mechanical exfoliation or the like, then patterning a resist mask on the graphene by photolithography or the like, and then etching redundant graphene with oxygen plasma or the like.

Next, insulating film 22 is formed on graphene layer 30, drain electrode 50 and source electrode 52 (S5). Insulating film 22 can be formed using vapor deposition, CVD, atomic layer deposition (ALD) or the like.

Next, electrode 60 and electrode 62 are formed on insulating film 22 (S6). Electrode 60 and electrode 62 can be formed by forming a resist mask having an opening over insulating film 22 using photolithography, EB drawing or the like, and then depositing a metal film made of Au or the like using EB vapor deposition, sputtering vapor deposition or the like, followed by liftoff. When forming electrode 60 and electrode 62, an adhesion film made of Cr, Ti or the like may be formed between electrode 60 and insulating film 22, or between electrode 62 and insulating film 22, in order to improve the adhesion to underlying insulating film 22.

Then, graphene layer 40 is formed on insulating film 22, electrode 60 and electrode 62 by being selectively grown by epitaxial growth (S7). Other than being formed by epitaxial growth that allows selective growth, graphene layer 40 may be formed by forming a film of graphene with a method of transferring and affixing graphene formed using CVD, or with a method of transferring and affixing graphene exfoliated from graphite due to mechanical exfoliation or the like, then patterning a resist mask on the graphene by photolithography or the like, and then etching redundant graphene with oxygen plasma or the like.

While the step of forming graphene layer 30 on drain electrode 50 and source electrode 52 has been described, graphene layer 30 may be formed first, and drain electrode 50 and source electrode 52 may be formed on that graphene layer 30. For electrode 60 and electrode 62, similarly, graphene layer 40 may be formed first, and electrode 60 and electrode 62 may be formed on that graphene layer 40. In this case, it is desirable to form a protective film on graphene layer 30 or graphene layer 40, since graphene layer 30 or graphene layer 40 suffers process damage in the vapor deposition during the formation of the electrodes. Such a protective film can suppress external contamination and the occurrence of noise, so that an electromagnetic wave detector with higher performance can be obtained.

As stated above, electromagnetic wave detector 1 in the present embodiment can be manufactured.

The electromagnetic wave detector and the method of manufacturing the same in the present embodiment configured as described above can detect electromagnetic waves in a broad wavelength region, to provide a sensitive electromagnetic wave detector having high response speed to electromagnetic waves.

Embodiment 2

In an electromagnetic wave detector in the present embodiment, unlike Embodiment 1, graphene layer 30 and graphene layer 40 do not have a laminated structure, but are formed on a plane, that is, in the same plane. The parts designated by the same reference signs are configured similarly to those of the electromagnetic wave detector in Embodiment 1, and thus descriptions are omitted.

Figure 5:
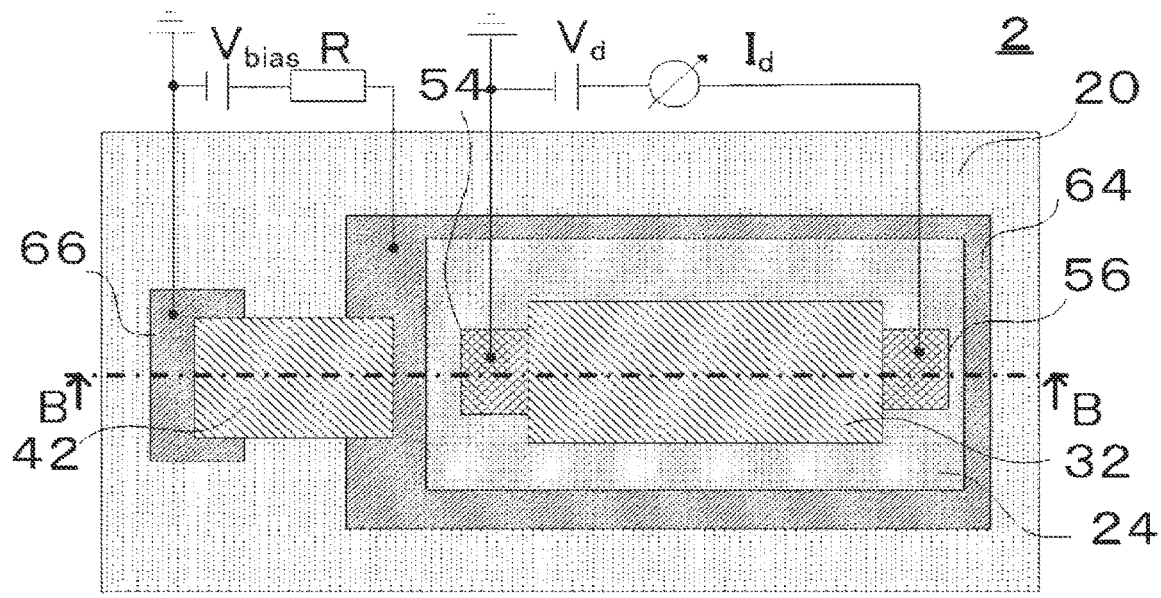
FIG. 5 is a plan view showing the configuration of an electromagnetic wave detector in Embodiment 2 of the present invention.
Figure 6:
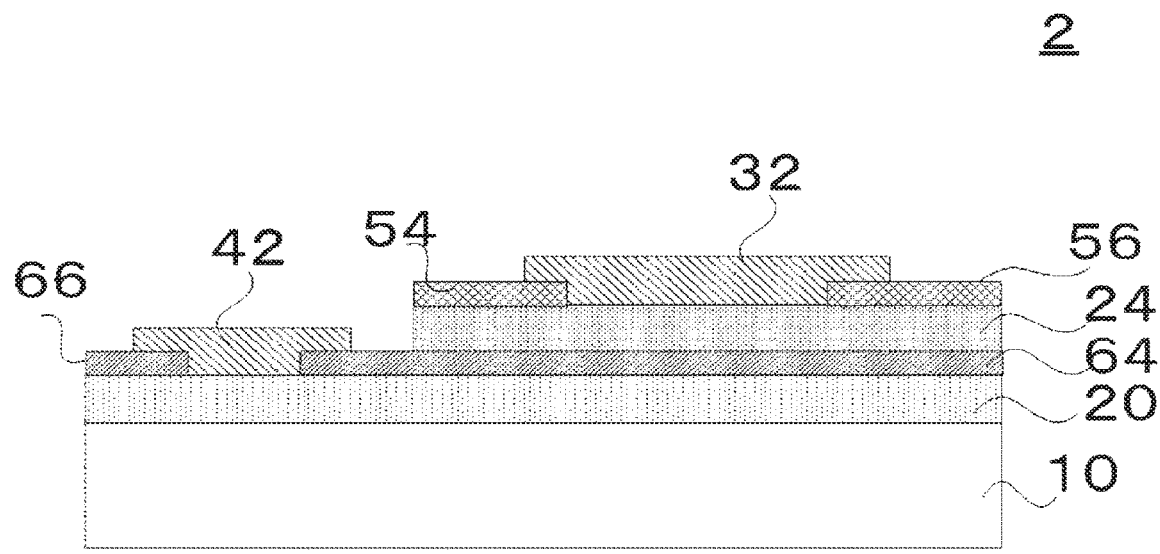
FIG. 6 is a sectional view showing the configuration of the electromagnetic wave detector in Embodiment 2 of the present invention.

FIG. 5 is a plan view showing the configuration of the electromagnetic wave detector in the present embodiment. FIG. 6 is a sectional view showing the configuration of the electromagnetic wave detector in the present embodiment, as seen along the section line B-B in FIG. 5.

Referring to FIGS. 5 and 6, the configuration of an electromagnetic wave detector 2 in the present embodiment is described.

Electromagnetic wave detector 2 in the present embodiment includes substrate 10, insulating film 20 provided on substrate 10, an electrode 64 and an electrode 66 provided on a surface of insulating film 20 opposite to the surface on which substrate 10 is provided, a graphene layer 42 provided on the surface of insulating film 20 opposite to the surface on which substrate 10 is provided, and electrically connected to electrode 64 and electrode 66, an insulating film 24 provided on electrode 64, a graphene layer 32 provided on insulating film 24, and a source electrode 54 and a drain electrode 56 provided on insulating film 24 and electrically connected to graphene layer 32.

As shown in FIG. 6, electrode 64 and electrode 66 are provided on insulating film 20 to contact the surface of insulating film 20 opposite to the surface on which substrate 10 is provided, and are electrically connected to graphene layer 42. Electrode 64 is provided on a surface of insulating film 24 opposite to the surface in contact with graphene layer 32. Between electrode 64 and electrode 66, as shown in FIG. 5, the power supply circuit that applies bias voltage $V_{bias}$ and a resistor R are electrically connected in order to provide potential change to graphene layer 32 through insulating film 24, and are configured such that a current flows in graphene layer 42. The material and the like of electrode 64 and electrode 66 are similar to those of electrode 60 and electrode 62 in Embodiment 1, and thus descriptions are omitted.

As shown in FIG. 6, graphene layer 42 is provided on insulating film 20 to cover a part of electrode 64 and electrode 66, and is electrically connected to electrode 64 and electrode 66. Note that the position where graphene layer 42 is provided is the end of electrode 64. The material, layer structure and the like of graphene layer 42 are similar to those of graphene layer 40 in Embodiment 1, and thus descriptions are omitted.

As shown in FIG. 6, insulating film 24 has an upper surface and a lower surface, is provided on electrode 64 to contact electrode 64 at the lower surface, and has graphene layer 32 provided on the upper surface. That is, insulating film 24 is provided on electrode 64 in a region different from the region where graphene layer 42 electrically connects to electrode 64. The material and the like of insulating film 24 are similar to those of insulating film 22 in Embodiment 1, and thus descriptions are omitted.

As shown in FIG. 6, source electrode 54 and drain electrode 56 are provided on the upper surface of insulating film 24, and electrically connected to graphene layer 32. As shown in FIG. 5, between source electrode 54 and drain electrode 56, the power supply circuit is connected in order to apply voltage $V_d$ to graphene layer 32, and an ammeter for detecting current $I_d$ in graphene layer 32 between source electrode 54 and drain electrode 56 is connected. The material and the like of source electrode 54 and drain electrode 56 are similar to those of drain electrode 50 and source electrode 52 in Embodiment 1, and thus descriptions are omitted.

As described above, voltage $V_d$ is applied between source electrode 54 and drain electrode 56, and an electromagnetic wave can be detected by detection of current change in graphene layer 32 between source electrode 54 and drain electrode 56.

As shown in FIG. 6, graphene layer 32 is provided on the upper surface of insulating film 24, provided to cover a part of source electrode 54 and drain electrode 56, and electrically connected to source electrode 54 and drain electrode 56. Specifically, graphene layer 32 is provided to face electrode 64 with insulating film 24 interposed therebetween, and graphene layer 32 is provided in a region different from the region where graphene layer 42 is formed. That is, the outermost surface of electromagnetic wave detector 2 in the present embodiment is provided with graphene layer 32 and graphene layer 42. The material, layer structure and the like of graphene layer 32 are similar to those of graphene layer 30 in Embodiment 1, and thus descriptions are omitted.

As stated above, electromagnetic wave detector 2 in the present embodiment is configured.

The operating principle of electromagnetic wave detector 2 in the present embodiment is now described.

First, in electromagnetic wave detector 2 in the present embodiment, since the power supply circuit that applies bias voltage $V_{bias}$ and resistor R are electrically connected between electrode 64 and electrode 66, a current flows in graphene layer 42 between electrode 64 and electrode 66.

When an electromagnetic wave is not incident on graphene layer 42, a potential induced in resistor R in response to a dark current flowing in graphene layer 42 is applied from electrode 64 to graphene layer 32 through insulating film 24. That is, with graphene layer 42 as a gate electrode, a gate voltage is applied from electrode 64 to graphene layer 32 through insulating film 24.

When this gate voltage provided to graphene layer 32 is represented by $V_g$, the characteristic of gate voltage $V_g$—current $I_d$ as indicated by the broken line in FIG. 3 is exhibited, in a curve indicating bipolar transistor operation in normal graphene, as in Embodiment 1.

When an electromagnetic wave is incident on graphene layer 42, on the other hand, graphene layer 42 performs photoelectric conversion, the current in graphene layer 42 to which bias voltage $V_{bias}$ is applied changes from the current when an electromagnetic wave is not incident, potential change is provided from electrode 64 through insulating film 24, and the gate voltage applied to graphene layer 32 changes. When the change in the gate voltage due to the change in the current of graphene layer 40 is represented by $V_{ph}$, the characteristic of gate voltage $V_g$—current $I_d$ when an electromagnetic wave is incident on graphene layer 42 draws the curve as indicated by the solid line in FIG. 3, with the gate voltage that provides the Dirac point shifted from $V_{DP}$ to $V_{DP}+V_{ph}$, as in Embodiment 1.

That is, when an electromagnetic wave is incident on graphene layer 42, the characteristic of gate voltage $V_g$—current $I_d$ is shifted from the curve indicated by the broken line in FIG. 3 to the curve indicated by the solid line in FIG. 3, causing generation of differential current of $\Delta I_{ph}$, which is change in electrical quantity associated with the change in the potential of graphene layer 42, in graphene layer 32 between source electrode 54 and drain electrode 56, as in Embodiment 1. By detecting this differential current $\Delta I_{ph}$ which is the change in electrical quantity, the incidence of an electromagnetic wave can be detected.

The effect of electromagnetic wave detector 2 in the present embodiment is similar to that of Embodiment 1, and thus descriptions are omitted. Electromagnetic wave detector 2 in the present embodiment can detect electromagnetic waves in a broad wavelength region, to provide a sensitive electromagnetic wave detector having high response speed to electromagnetic waves, as in Embodiment 1.

Any configuration may be used so long as a potential is provided to graphene layer 42, and potential change in graphene layer 42 is provided from electrode 64 to graphene layer 32 through insulating film 22, without being limited to the circuit configuration described above.

The configuration of detecting current change in graphene layer 32 as described above is not restrictive. For example, a constant current may be passed between source electrode 54 and drain electrode 56 to detect a voltage value of graphene layer 32 between source electrode 54 and drain electrode 56, or only one of source electrode 54 and drain electrode 56 may be formed and potential change in graphene layer 32 may be detected. Any configuration capable of detecting change in electrical quantity in graphene layer 32 may be used.

Figure 7:
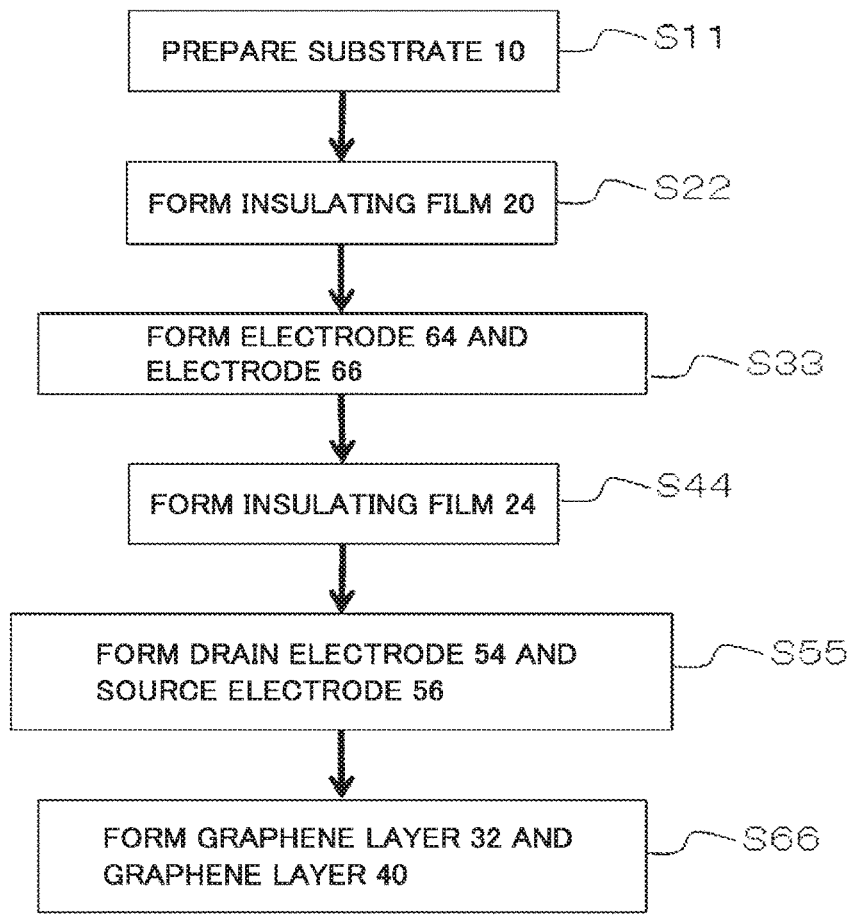
FIG. 7 is a flow diagram showing steps of manufacturing the electromagnetic wave detector in Embodiment 2 of the present invention.

A method of manufacturing electromagnetic wave detector 2 in the present embodiment is now described. FIG. 7 is a flow diagram showing steps of manufacturing electromagnetic wave detector 2 in the present embodiment.

First, substrate 10 having the front surface and the back surface facing and parallel to the front surface, and formed of a silicon substrate, for example, is prepared (S11).

Next, insulating film 20 is formed on substrate 10 (S22). If substrate 10 is a silicon substrate, for example, insulating film 20 may be a silicon oxide film formed by thermal oxidation, or another insulating film formed using CVD or sputtering.

Next, electrode 64 and electrode 66 are formed on insulating film 20 (S33). Electrode 64 and electrode 66 can be formed by forming a resist mask having an opening over insulating film 20 using photolithography, EB drawing or the like, and then depositing a metal film made of Au or the like using EB vapor deposition, sputtering vapor deposition or the like, followed by liftoff. When forming electrode 64 and electrode 66, an adhesion film made of Cr, Ti or the like may be formed between electrode 64 and insulating film 20, or between electrode 66 and insulating film 20, in order to improve the adhesion to underlying insulating film 20.

Next, insulating film 24 is formed on electrode 64 (S44). Insulating film 24 can be formed using vapor deposition, CVD, ALD or the like.

Next, source electrode 54 and drain electrode 56 are formed on insulating film 24 (S55). Source electrode 54 and drain electrode 56 can be formed by forming a resist mask having an opening over insulating film 24 using photolithography, EB drawing or the like, and then depositing a metal film made of Au or the like using EB vapor deposition, sputtering vapor deposition or the like, followed by liftoff. When forming source electrode 54 and drain electrode 56, an adhesion film made of Cr, Ti or the like may be formed between source electrode 54 and insulating film 24, or between drain electrode 56 and insulating film 24, in order to improve the adhesion to underlying insulating film 24.

Then, graphene layer 42 is formed on insulating film 20, electrode 64 and electrode 66, and graphene layer 32 is formed on insulating film 24, source electrode 54 and drain electrode 56, by being selectively grown together by epitaxial growth (S66). Other than being formed by epitaxial growth that allows selective growth, graphene layer 32 and graphene layer 42 may be formed by forming a film of graphene with a method of transferring and affixing graphene formed using CVD, or with a method of transferring and affixing graphene exfoliated from graphite due to mechanical exfoliation or the like, then patterning a resist mask on the graphene by photolithography or the like, and then etching redundant graphene with oxygen plasma or the like.

As stated above, electromagnetic wave detector 2 in the present embodiment can be manufactured.

In Embodiment 1, graphene layer 30 is formed, then insulating film 22, electrode 60 and electrode 62 are formed, and then graphene layer 40 is formed, whereas in the method of manufacturing electromagnetic wave detector 2 in the present embodiment, as described above, graphene layer 32 and graphene layer 42 are formed together after insulating film 20, insulating film 24, source electrode 54, drain electrode 56, and electrode 64 and electrode 66 have been formed on substrate 10.

In Embodiment 1, since insulating film 22, electrode 60, electrode 62 and graphene layer 40 are formed after graphene layer 30 has been formed, these processes may cause process damage, adhesion of impurities and the like to graphene layer 30, causing degradation in mobility in graphene layer 30, resulting in reduction in sensitivity and degradation in response speed of the electromagnetic wave detector.

In electromagnetic wave detector 2 in the present embodiment, however, since graphene layer 32 and graphene layer 42 are formed together after insulating film 20, insulating film 24, source electrode 54, drain electrode 56, and electrode 64 and electrode 66 have been formed, the processes of forming insulating film 20, insulating film 24, source electrode 54, drain electrode 56, and electrode 64 and electrode 66 do not cause process damage, adhesion of impurities and the like to graphene layer 32 and graphene layer 42. Thus, the reduction in sensitivity and the degradation in response speed of the electromagnetic wave detector can be prevented, so that a high-performance electromagnetic wave detector can be provided.

In addition, since graphene layer 32 and graphene layer 42 are formed together, the method of manufacturing the electromagnetic wave detector in the present embodiment can reduce the number of processes of forming the graphene layers, thereby reducing the number of manufacturing steps to cut manufacturing costs.

As stated above, the electromagnetic wave detector and the method of manufacturing the same in the present embodiment configured as described above can detect electromagnetic waves in a broad wavelength region, to provide a sensitive electromagnetic wave detector having high response speed to electromagnetic waves, as in Embodiment 1. In addition, the electromagnetic wave detector and the method of manufacturing the same in the present embodiment can suppress the process damage and the adhesion of impurities to the graphene layers, to prevent the reduction in sensitivity and the degradation in response speed of the electromagnetic wave detector, thereby providing a high-performance electromagnetic wave detector. In addition, the electromagnetic wave detector and the method of manufacturing the same in the present embodiment can reduce the number of processes of forming the graphene layers, thereby reducing the number of manufacturing steps to cut manufacturing costs.

Embodiment 3

In an electromagnetic wave detector in the present embodiment, unlike Embodiment 1, a graphene layer 44 is disposed closer to source electrode 52 than to drain electrode 50. The parts designated by the same reference signs are configured similarly to those of the electromagnetic wave detector in Embodiment 1, and thus descriptions are omitted.

Figure 8:
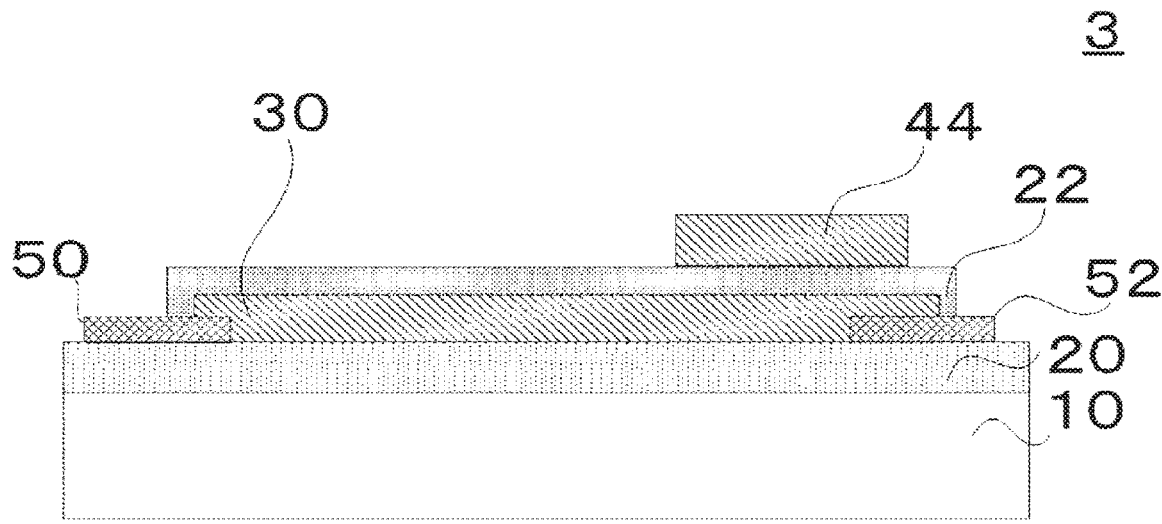
FIG. 8 is a sectional view showing the configuration of an electromagnetic wave detector in Embodiment 3 of the present invention.

FIG. 8 is a sectional view showing the configuration of the electromagnetic wave detector in the present embodiment, as seen along the section line A-A in FIG. 1 in the same manner as Embodiment 1.

As shown in FIG. 8, in an electromagnetic wave detector 3 in the present embodiment, graphene layer 44 is provided on insulating film 22, and disposed closer to source electrode 52 than to drain electrode 50. That is, a distance between source electrode 52 and graphene layer 44 is smaller than a distance between drain electrode 50 and graphene layer 44, with graphene layer 44 being asymmetrically arranged between drain electrode 50 and source electrode 52 in plan view. In addition, in electromagnetic wave detector 3 in the present embodiment, unlike Embodiment 1, the power supply circuit that applies voltage $V_d$ is not connected between drain electrode 50 and source electrode 52, and only the configuration of detecting current $I_d$ between drain electrode 50 and source electrode 52 is provided.

The term "asymmetrically arranged" as used herein refers to asymmetry of the arrangement or shape of graphene 44 with a centerline 80 in FIG. 1 between drain electrode 50 and source electrode 52 in plan view as the axis of symmetry. That is, in addition to the asymmetric arrangement obtained by disposing graphene layer 44 closer to source electrode 52 as described above, graphene layer 44 having an asymmetrical shape with respect to the axis of symmetry in plan view may be disposed on the axis of symmetry, or the arrangement and shape of graphene layer 44 may both be asymmetrical.

As stated above, electromagnetic wave detector 3 in the present embodiment is configured. A method of manufacturing electromagnetic wave detector 3 in the present embodiment is similar to that of Embodiment 1, and thus descriptions are omitted.

Figure 9:
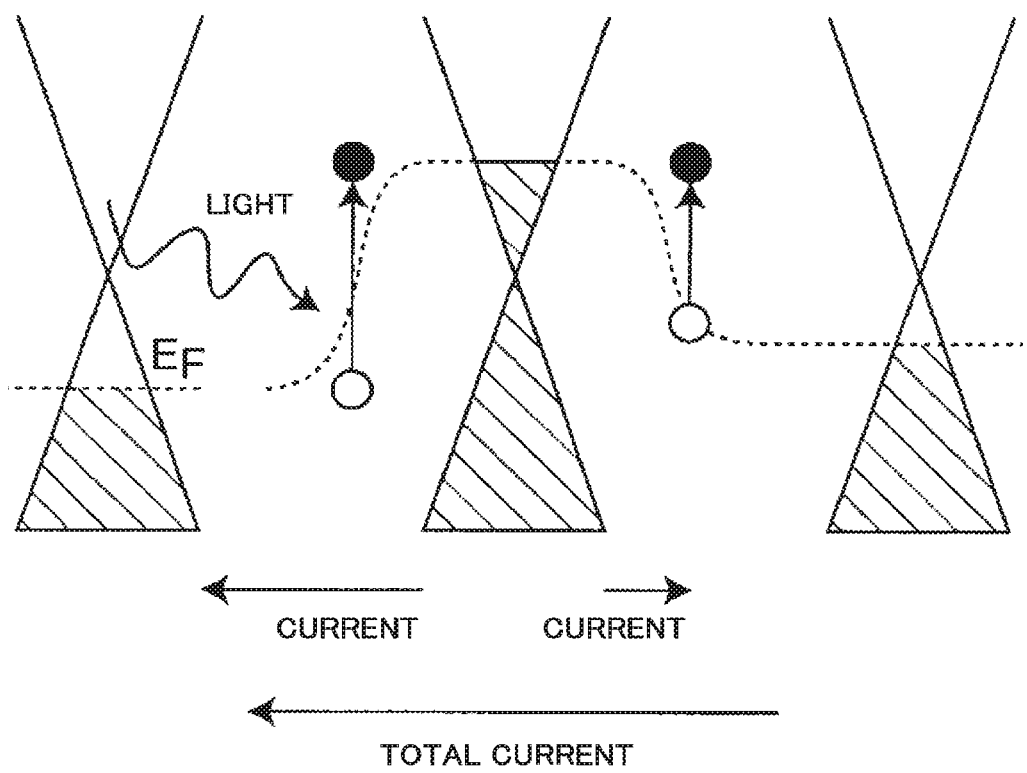
FIG. 9 illustrates the operating principle of the electromagnetic wave detector in Embodiment 3 of the present invention.

The operating principle of electromagnetic wave detector 3 in the present embodiment is now described. FIG. 9 illustrates the operating principle of the electromagnetic wave detector in the present embodiment. The basic operating principle is similar to that of Embodiment 1, and thus detailed descriptions are omitted, and only characteristic portions of the present embodiment are described.

As was described in Embodiment 1 above, when a gate voltage is applied from graphene layer 40 to graphene layer 30, different gate voltages will be applied between the regions in graphene layer 30 where graphene layer 40 is provided and graphene layer 40 is not provided. Thus, regions of different carrier densities are formed between the regions in graphene layer 30 where graphene layer 40 is provided and graphene layer 40 is not provided, causing formation of a potential gradient of a pseudo PNP junction or NPN junction in graphene layer 30.

In Embodiment 1, as shown in FIG. 1, graphene layer 40 is symmetrically arranged above graphene layer 30, with centerline 80 between drain electrode 50 and source electrode 52 in plan view as the axis of symmetry. In this case, this potential gradient in graphene layer 30 is also symmetrical between drain electrode 50 and source electrode 52. Thus, differential currents generated in graphene layer 30 associated with potential change in graphene layer 40 due to an incident electromagnetic wave flow in opposite directions in the same amount in regions of graphene layer 30 on the drain electrode 50 side and the source electrode 52 side, and are canceled out and become zero. In Embodiment 1, therefore, the differential current associated with the incidence of an electromagnetic wave is detected by application of the bias voltage of voltage $V_d$ between drain electrode 50 and source electrode 52.

In contrast, in electromagnetic wave detector 3 in the present embodiment, graphene layer 44 is disposed closer to the source electrode than to drain electrode 50, that is, asymmetrically arranged between drain electrode 50 and source electrode 52, in plan view. Thus, the potential gradient in graphene layer 30 upon application of the gate voltage from graphene layer 40 to graphene layer 30 is asymmetrical between right and left as shown in FIG. 9. With this asymmetrical potential gradient, the sum of currents flowing in graphene layer 30 between drain electrode 50 and source electrode 52 are not canceled, and a current flows between drain electrode 50 and source electrode 52 without the application of the bias voltage between drain electrode 50 and source electrode 52. That is, the differential current generated in graphene layer 30 associated with the potential change that occurs in graphene layer 40 can be detected without the application of the bias voltage between drain electrode 50 and source electrode 52.

Therefore, electromagnetic wave detector 3 in the present embodiment can detect an electromagnetic wave without applying the bias voltage between drain electrode 50 and source electrode 52. Without the application of the bias voltage, an electromagnetic wave detector with little noise and low power consumption can be provided.

As stated above, the electromagnetic wave detector in the present embodiment configured as described above can detect electromagnetic waves in a broad wavelength region, to provide a sensitive electromagnetic wave detector having high response speed to electromagnetic waves, as in Embodiment 1. In addition, the electromagnetic wave detector in the present embodiment can detect an electromagnetic wave without applying the bias voltage between the drain electrode and the source electrode, to provide an electromagnetic wave detector with little noise and low power consumption.

While graphene layer 44 is disposed closer to source electrode 52 than to drain electrode 50 in electromagnetic wave detector 3 in the present embodiment, graphene layer 44 should only be arranged asymmetrically. For example, graphene layer 44 may be disposed closer to drain electrode 50 than to source electrode 52.

In addition, graphene layer 44 is not limited to the arrangement or shape as described above. Any arrangement or shape of graphene layer 44 may be used in which the Fermi level in graphene layer 30 described above is obtained, that is, the potential gradient is asymmetrical.

The configuration of the electromagnetic wave detector in the present embodiment is also applicable to Embodiment 2. In this case, electrode 64 provided below graphene layer 32 can be provided partially, rather than entirely, below graphene layer 32, and electrode 64 can be asymmetrically arranged, or provided in an asymmetrical shape, with respect to a centerline between source electrode 54 and drain electrode 56 in plan view as the axis of symmetry, to thereby provide an electromagnetic wave detector with little noise and low power consumption having the same effect as the present embodiment.

Embodiment 4

An electromagnetic wave detector in Embodiment 4 of the present invention has, unlike Embodiment 1, a plurality of graphene layers 46 on insulating film 22, which are spaced apart in an in-plane direction of substrate 10. The parts designated by the same reference signs are configured similarly to those of the electromagnetic wave detector in Embodiment 1, and thus descriptions are omitted.

Figure 10:
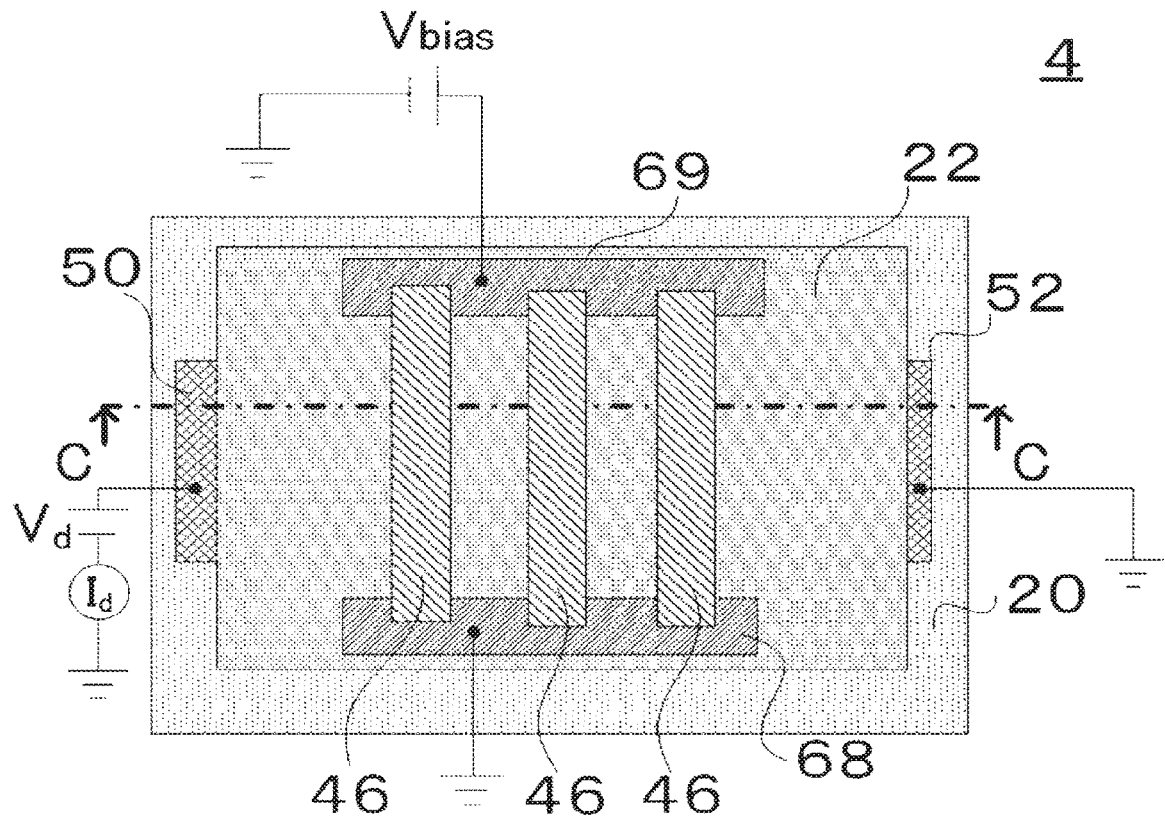
FIG. 10 is a plan view showing the configuration of an electromagnetic wave detector in Embodiment 4 of the present invention.
Figure 11:
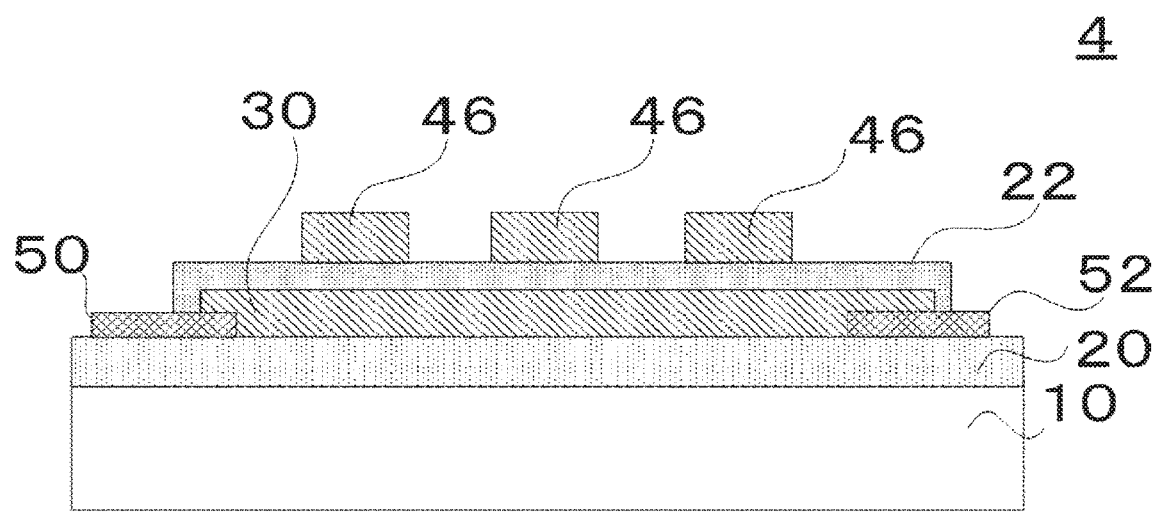
FIG. 11 is a sectional view showing the configuration of the electromagnetic wave detector in Embodiment 4 of the present invention.

FIG. 10 is a plan view showing the configuration of the electromagnetic wave detector in the present embodiment. FIG. 11 is a sectional view showing the configuration of the electromagnetic wave detector in the present embodiment, as seen along the section line C-C in FIG. 10.

Referring to FIGS. 10 and 11, the configuration of an electromagnetic wave detector 4 in the present embodiment is described.

Electromagnetic wave detector 4 in the present embodiment includes the plurality of graphene layers 46 provided on insulating film 22 and spaced apart in the in-plane direction of substrate 10. Assuming that upward and downward directions in the plane of the drawing are a vertical direction and rightward and leftward directions in the plane of the drawing are a horizontal direction, then the plurality of graphene layers 46 are provided between drain electrode 50 and source electrode 52 to face graphene layer 30, extend in the vertical direction in plan view, and are spaced apart and parallel to one another in the horizontal direction. Electromagnetic wave detector 4 in the present embodiment further includes an electrode 68 commonly and electrically connecting one ends of the plurality of graphene layers 46, and an electrode 69 commonly and electrically connecting the other ends. The configuration is otherwise similar that of Embodiment 1, and thus descriptions are omitted.

The operating principle of electromagnetic wave detector 4 in the present embodiment is now described. The basic operating principle is similar to that of Embodiment 1, and thus detailed descriptions are omitted, and only characteristic portions of the present embodiment are described.

As described above, electromagnetic wave detector 4 in the present embodiment has the plurality of graphene layers 46 that are provided between drain electrode 50 and source electrode 52 to face graphene layer 30, extend in the vertical direction in plan view, and are spaced apart and parallel to one another in the horizontal direction. In graphene layer 30, therefore, a plurality of electron density gradients are formed due to gate voltages applied from the plurality of graphene layers 46. Furthermore, by applying the bias voltage between drain electrode 50 and source electrode 52, a stepped electron density gradient is formed in graphene layer 30.

The formation of the stepped electron density gradient has the same effect as increasing the bias voltage applied between drain electrode 50 and source electrode 52, and can improve the efficiency of extracting the differential current in graphene layer 30. That is, electromagnetic wave detector 4 in the present embodiment can provide a more sensitive electromagnetic wave detector than Embodiment 1.

As stated above, the electromagnetic wave detector in the present embodiment configured as described above can detect electromagnetic waves in a broad wavelength region, to provide an electromagnetic wave detector having high response speed to electromagnetic waves, as in Embodiment 1, and provide a more sensitive electromagnetic wave detector.

While three graphene layers 46 have been described by way of example in the present embodiment, a similar effect can be obtained when there are two or more graphene layers 46. The space between and the number of graphene layers 46 can be adjusted as appropriate. In addition, while three graphene layers 46 are symmetrically arranged between drain electrode 50 and source electrode 52 over graphene layer 30 in the present embodiment, they can be asymmetrically arranged so as to produce the effect of Embodiment 3.

In addition, while electrode 68 and electrode 69 commonly connected to three graphene layers 46 are provided in the present embodiment, an electrode may be provided for each graphene layer 46 to apply a different voltage, in order to apply a different voltage to each graphene layer 46.

The configuration of the electromagnetic wave detector in the present embodiment is also applicable to Embodiment 2. In this case, electrode 64 provided below graphene layer 32 can be provided partially, rather than entirely, below graphene layer 32, and a plurality of these electrodes can be provided that extend in the vertical direction between source electrode 54 and drain electrode 56 in plan view, and are spaced apart and parallel to one another in the horizontal direction, to thereby provide an electromagnetic wave detector having the same effect as the present embodiment.

Embodiment 5

In an electromagnetic wave detector in Embodiment 5 of the present invention, unlike the other embodiments, graphene layers 48 have a periodic structure that causes resonance of an incident electromagnetic wave. The parts designated by the same reference signs are configured similarly to those of the electromagnetic wave detector in Embodiment 1, and thus descriptions are omitted.

Figure 12:
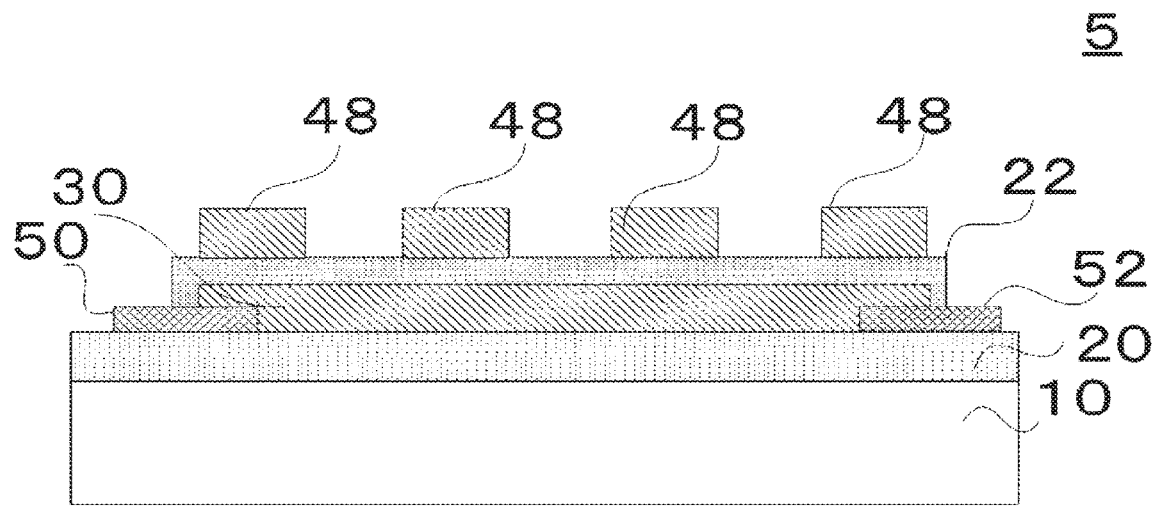
FIG. 12 is a sectional view showing the configuration of an electromagnetic wave detector in Embodiment 5 of the present invention.

FIG. 12 is a sectional view showing the configuration of the electromagnetic wave detector in the present embodiment, as seen along the section line C-C in FIG. 10 in the same manner as Embodiment 4.

An electromagnetic wave detector 5 in the present embodiment includes graphene layers 48 having a periodic structure that causes resonance of an incident electromagnetic wave. Specifically, as shown in FIG. 12, the electromagnetic wave detector has the plurality of graphene layers 48, which extend in the vertical direction in plan view between drain electrode 50 and source electrode 52, and are periodically arranged at regular intervals parallel to one another in the horizontal direction.

The operating principle of electromagnetic wave detector 5 in the present embodiment is similar to those of Embodiment 1 and Embodiment 4, and thus detailed descriptions are omitted. In electromagnetic wave detector 5 in the present embodiment, by arranging graphene layers 48 in a period that causes resonance of an incident electromagnetic wave, for example, the incident electromagnetic wave can also be diffracted, or a surface wave can be formed by surface plasmon resonance.

Graphene is known as a material with low loss when propagating surface plasmon resonance. Thus, an electromagnetic wave coupled to the surface of graphene can be propagated as a plasmon polariton on the surfaces of graphene layers 48. That is, the photoelectric conversion efficiency of graphene layers 48 can be improved at such a plasmon resonance wavelength, to enhance the sensitivity of the electromagnetic wave detector. If a plurality of graphene layers 48 having different widths are periodically arranged, multiple resonance wavelengths are provided, and plasmon resonance in a broad wavelength region can be generated in a selective wavelength region.

If graphene layers 48 are periodically arranged on insulating film 22, the diffraction or plasmon resonance varies depending on the polarization of an incident electromagnetic wave, for example. As a result, a specific polarized light can be diffracted or coupled to the surfaces of graphene layers 48 by graphene layers 48. That is, only the specific wavelength and polarized light of the incident electromagnetic wave is coupled to graphene layers 48. Thus, electromagnetic wave detector 5 in the present embodiment can detect only the specific wavelength and polarized light of the electromagnetic wave, to selectively detect the electromagnetic wave of the specific wavelength. In this manner, electromagnetic wave detector 5 in the present embodiment can detect specific polarized light of an electromagnetic wave, and can thus be applied to a polarization imaging device. An operating wavelength region of electromagnetic wave detector 5 in the present embodiment is determined depending on the period and width of graphene layers 48.

As stated above, the electromagnetic wave detector in the present embodiment configured as described above can provide a sensitive electromagnetic wave detector having high response speed to electromagnetic waves, as in Embodiment 1. In addition, electromagnetic wave detector 5 in the present embodiment can detect only specific polarized light of an electromagnetic wave, to thereby selectively detect an electromagnetic wave of a specific wavelength.

While the plurality of graphene layers 48 extending in the vertical direction in plan view are periodically arranged in the horizontal direction as shown in FIG. 12 in the present embodiment, this is not necessarily restrictive. Any periodic structure that causes resonance of an incident electromagnetic wave may be used. For example, graphene layers 48 can be provided in a periodic lattice, or in another periodic shape having symmetry, to set the shape of graphene layers 48 as appropriate in various ways within the scope not departing from the gist of the present embodiment.

In addition, in the present embodiment, an electrode may be provided for each graphene layer 48 to apply a different voltage, in order to apply a different voltage to each graphene layer 48. In this case, the wavelength of an electromagnetic wave to which graphene layer 48 responds can be electrically controlled.

The configuration of the electromagnetic wave detector in the present embodiment is also applicable to Embodiment 2. In this case, electrode 64 provided below graphene layer 32 can be provided partially, rather than entirely, below graphene layer 32, and this electrode having a periodic structure that causes resonance of an electromagnetic wave incident between source electrode 54 and drain electrode 56 in plan view can be provided, to thereby provide an electromagnetic wave detector having the same effect as the present embodiment.

Embodiment 6

An electromagnetic wave detector in Embodiment 6 of the present invention includes, unlike the other embodiments, an electrode 70 which is electrically connected to substrate 10 and to which a back gate voltage $V_{bg}$ is applied. The parts designated by the same reference signs are configured similarly to those of the electromagnetic wave detector in Embodiment 1, and thus descriptions are omitted.

Figure 13:
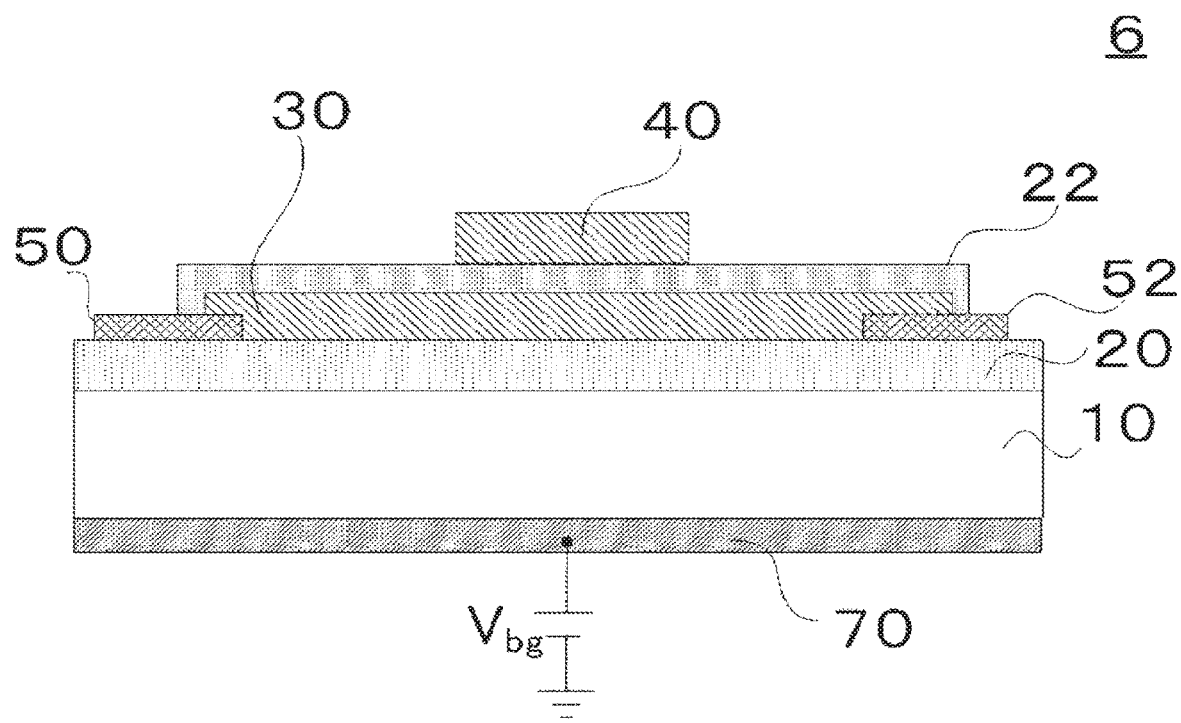
FIG. 13 is a sectional view showing the configuration of an electromagnetic wave detector in Embodiment 6 of the present invention.

FIG. 13 is a sectional view showing the configuration of the electromagnetic wave detector in the present embodiment, as seen along the section line A-A in FIG. 1 in the same manner as Embodiment 1.

An electromagnetic wave detector 6 in the present embodiment includes electrode 70 which is electrically connected to substrate 10 and to which back gate voltage $V_{bg}$ is applied. As shown in FIG. 13, electrode 70 is provided on the back surface of substrate 10, and is connected to a power supply circuit in order to apply back gate voltage $V_{bg}$ to graphene layer 30. Electrode 70 is made of metal such as Au, Ag, Cu, Al, Ni, Cr or Pd.

Here, substrate 10 may be, for example, a silicon substrate doped with an impurity. Alternatively, electrode 70 may be provided on the back surface of insulating film 20 instead of substrate 10. If substrate 10 is a silicon substrate doped with an impurity, it is preferable that electrode 70 electrically connect to substrate 10 by ohmic contact.

The operating principle of electromagnetic wave detector 6 in the present embodiment is now described. The basic operating principle is similar to that of Embodiment 1, and thus detailed descriptions are omitted, and only characteristic portions of the present embodiment are described.

Electromagnetic wave detector 6 in the present embodiment includes electrode 70 which is electrically connected to substrate 10 and to which back gate voltage $V_{bg}$ is applied. Thus, the gate voltage applied to graphene layer 30 can be controlled not only by the bias voltage applied from graphene layer 40, but also by back gate voltage $V_{bg}$ applied from electrode 70.

That is, an electronic state density in graphene layer 30 can be controlled not only by graphene layer 40, but also by back gate voltage $V_{bg}$. Accordingly, the electronic state density in graphene layer 30 can be adjusted by back gate voltage $V_{bg}$ so as to enhance the efficiency of extracting the detection current in graphene layer 30.

Conversely, by controlling back gate voltage $V_{bg}$ such that the electronic state density in graphene layer 30 is symmetrical, a current flowing in graphene layer 30 without incidence of an electromagnetic wave can be zeroed, and a dark current which is a disadvantage of an electromagnetic wave detector using graphene can be zeroed, so that an electromagnetic wave detector with little noise can be provided.

As stated above, the electromagnetic wave detector in the present embodiment configured as described above can detect electromagnetic waves in a broad wavelength region, to provide a sensitive electromagnetic wave detector having high response speed to electromagnetic waves, as in Embodiment 1. In addition, the electromagnetic wave detector in the present embodiment can enhance the efficiency of extracting the detection current in the graphene layer, to thereby provide a more sensitive electromagnetic wave detector, and can zero the dark current, to thereby provide an electromagnetic wave detector with little noise.

The configuration of the electromagnetic wave detector in the present embodiment is also applicable to the other embodiments.

Embodiment 7

In an electromagnetic wave detector in Embodiment 7 of the present invention, unlike the other embodiments, a drain electrode 58 and a source electrode 59 are made of metallic materials different from each other. The parts designated by the same reference signs are configured similarly to those of the electromagnetic wave detector in Embodiment 1, and thus descriptions are omitted.

Figure 14:
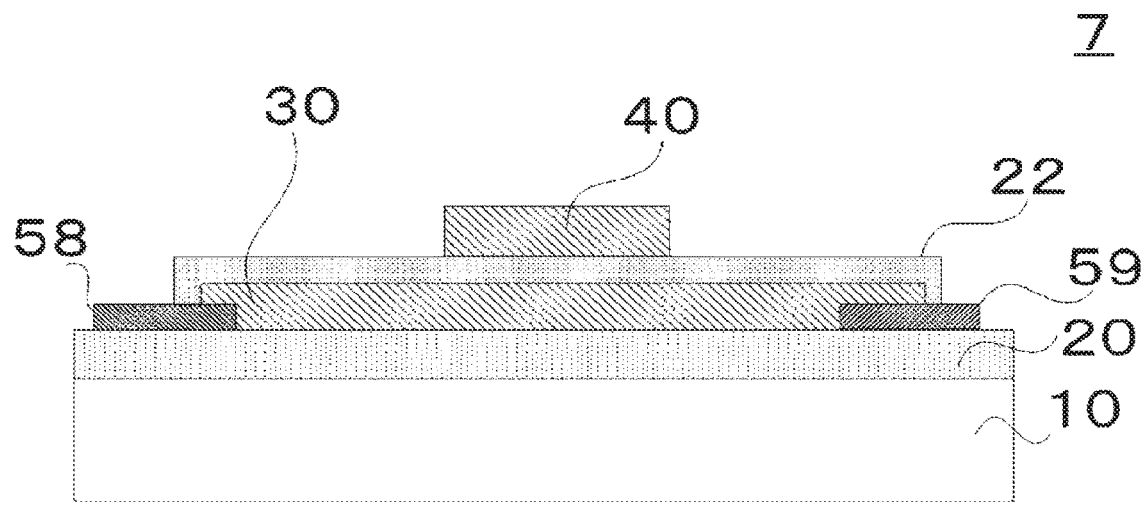
FIG. 14 is a sectional view showing the configuration of an electromagnetic wave detector in Embodiment 7 of the present invention.

FIG. 14 is a sectional view showing the configuration of the electromagnetic wave detector in the present embodiment, as seen along the section line A-A in FIG. 1 in the same manner as Embodiment 1.

As shown in FIG. 14, in an electromagnetic wave detector 7 in the present embodiment, drain electrode 58 and source electrode 59 are made of metallic materials different from each other. Metallic materials different from each other for drain electrode 58 and source electrode 59 are selected as appropriate from metals such as Au, Ag, Cu, Al, Ni, Cr or Pd.

The operating principle of electromagnetic wave detector 7 in the present embodiment is now described. The basic operating principle is similar to that of Embodiment 1, and thus detailed descriptions are omitted, and only characteristic portions of the present embodiment are described.

In graphene, the Fermi level moves and the contact resistance varies, depending on the type of metal with which the graphene is in contact. Thus, when drain electrode 58 and source electrode 59 are made of metallic materials different from each other, an energy gap of graphene layer 30 varies between drain electrode 58 and source electrode 59, for example, because different metals have different work functions. As a result, when an electromagnetic wave is incident, a photocurrent between drain electrode 58 and source electrode 59 increases by generated carriers, so that the sensitivity of the electromagnetic wave detector can be improved. While drain electrode 58 and source electrode 59 may have an oblong shape in plan view, they are not limited thereto.

As stated above, the electromagnetic wave detector in the present embodiment configured as described above can detect electromagnetic waves in a broad wavelength region, to provide a sensitive electromagnetic wave detector having high response speed to electromagnetic waves, as in Embodiment 1. The electromagnetic wave detector in the present embodiment can also increase the photocurrent between the electrodes, to thereby provide a more sensitive electromagnetic wave detector.

By forming drain electrode 58 and source electrode 59 in the shape of a bow-tie antenna, or by reducing the distance between drain electrode 58 and source electrode 59, an antenna effect or plasmon resonance between the electrodes can be produced, to enhance the efficiency of detecting only a specific wavelength.

While drain electrode 58 and source electrode 59 have been described as being made of metallic materials different from each other by way of example in the present embodiment, electrode 60 and electrode 62 may be made of metallic materials different from each other.

The configuration of the electromagnetic wave detector in the present embodiment is also applicable to the other embodiments.

Embodiment 8

In an electromagnetic wave detector in Embodiment 8 of the present invention, unlike Embodiment 1, insulating film 20 is provided with an opening 11 at which substrate 10 is exposed, and a graphene layer 34 and substrate 10 are in contact with each other. The parts designated by the same reference signs are configured similarly to those of the electromagnetic wave detector in Embodiment 1, and thus descriptions are omitted.

Figure 15:
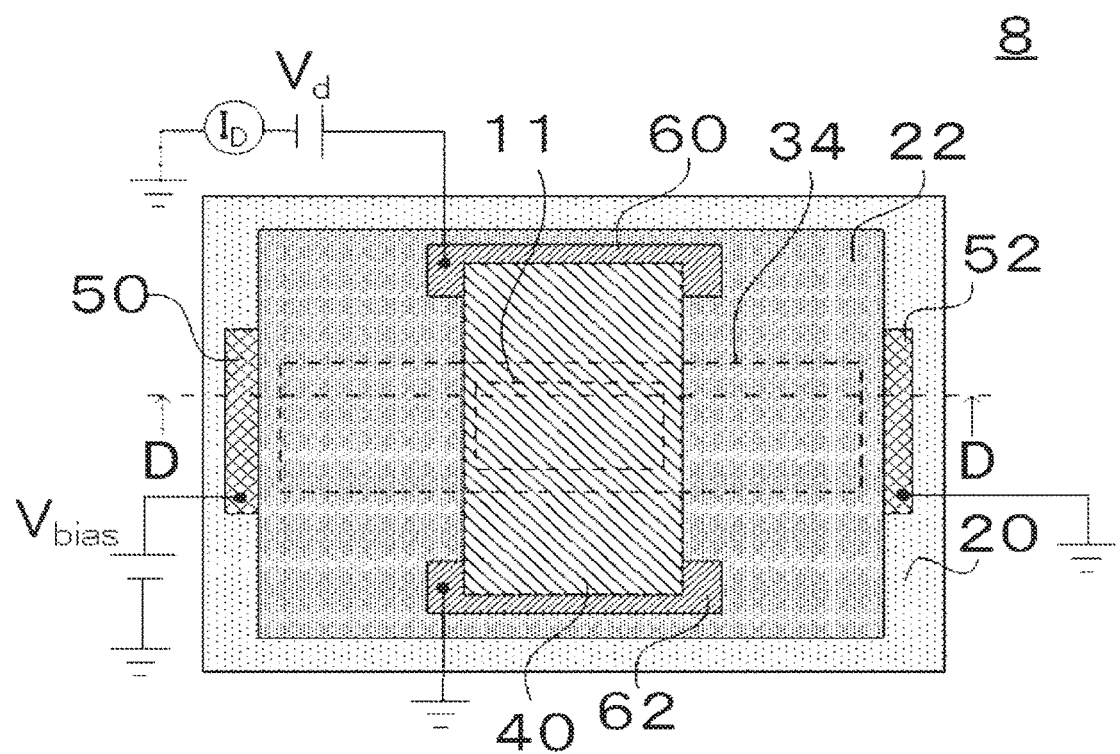
FIG. 15 is a plan view showing the configuration of an electromagnetic wave detector in Embodiment 8 of the present invention.
Figure 16:
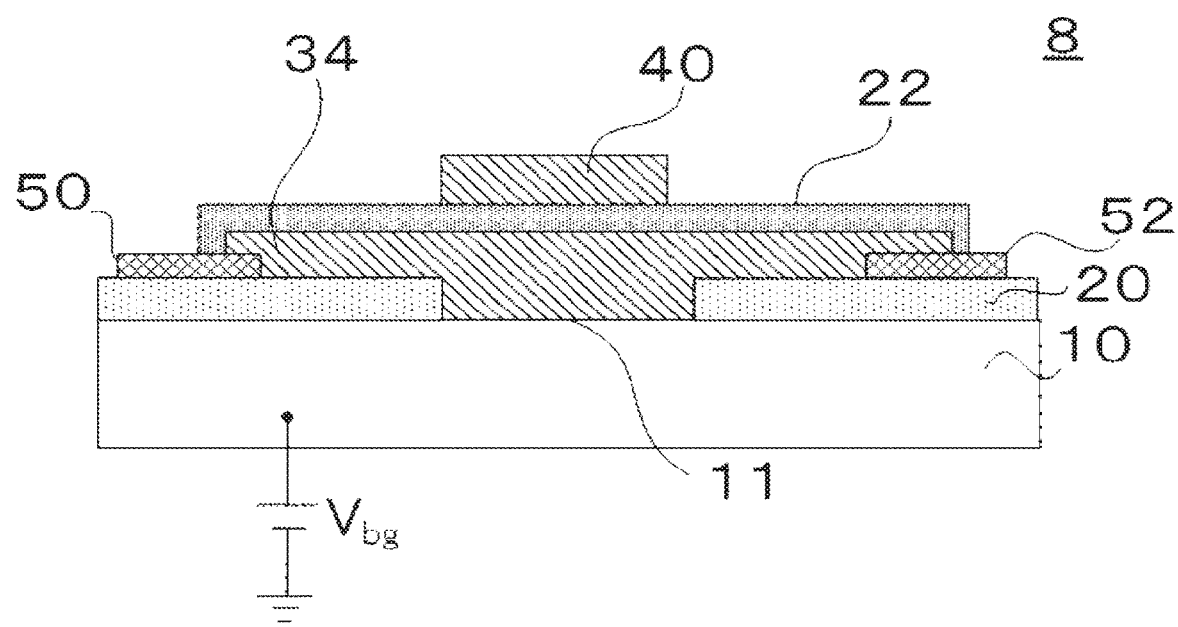
FIG. 16 is a sectional view showing the configuration of the electromagnetic wave detector in Embodiment 8 of the present invention.

FIG. 15 is a plan view showing the configuration of the electromagnetic wave detector in the present embodiment. FIG. 16 is a sectional view showing the configuration of the electromagnetic wave detector in the present embodiment, as seen along the section line D-D in FIG. 15.

As shown in FIGS. 15 and 16, in an electromagnetic wave detector 8 in the present embodiment, insulating film 20 is provided with opening 11 at which substrate 10 is exposed, and graphene layer 34 and substrate 10 are in contact with each other in a partial region. Specifically, as shown in FIG. 15, opening 11 having an oblong shape in plan view is provided in insulating film 20 below graphene layer 40, and substrate 10 is exposed at insulating film 20 by this opening 11. Graphene layer 34 is provided in this opening 11, and graphene layer 34 and substrate 10 are in contact with each other in a partial region.

In addition, unlike Embodiment 1, back gate voltage $V_{bg}$ is applied to substrate 10, bias voltage $V_{bias}$ is applied to drain electrode 50, and source electrode 52 is grounded. In addition, unlike Embodiment 1, voltage $V_d$ is applied between electrode 60 and electrode 62, and change in current $I_d$ in graphene layer 40 between electrode 60 and electrode 62 can be detected.

The shape of opening 11 in plan view is not limited to the oblong shape. Any shape may be used so long as graphene layer 34 and substrate 10 are in contact with each other, such as a rectangular shape, a circular shape, an elliptical shape or other polygonal shapes.

The operating principle of electromagnetic wave detector 8 in the present embodiment is now described, with reference to an example where substrate 10 is a silicon substrate.

When light of a visible wavelength, for example, which causes a silicon substrate to perform photoelectric conversion, is incident on the silicon substrate which is substrate 10, for example, photoelectric conversion occurs in the silicon substrate, to generate carries in the silicon substrate.

With back gate voltage $V_{bg}$ being applied to the silicon substrate which is substrate 10, charge of one of the carriers, that is, electrons and holes, generated by the photoelectric conversion in the silicon substrate is attracted toward graphene layer 34 and injected into graphene layer 34.

With bias voltage $V_{bias}$ being applied between drain electrode 50 and source electrode 52, the charge injected into graphene layer 34 is extracted at drain electrode 50 or source electrode 52, causing a current to flow in graphene layer 34. That is, potential change occurs in graphene layer 34, with respect to the wavelength region of the electromagnetic wave that causes photoelectric conversion to occur in the silicon substrate which is substrate 10.

As a result of this potential change in graphene layer 34, graphene layer 40 generates a differential current which is change in electrical quantity associated with the optical gate effect described above. By detecting this differential current, electromagnetic wave detector 8 in the present embodiment can detect the electromagnetic wave, with respect to the wavelength region of the electromagnetic wave that causes photoelectric conversion to occur in the silicon substrate which is substrate 10.

Here, since the mobility of graphene in graphene layer 34 is higher than the life of the carriers injected into graphene layer 34, the carriers injected into graphene layer 34 can be extracted at drain electrode 50 or source electrode 52, in addition to the carriers generated by the photoelectric conversion in graphene layer 34, and the current flowing in graphene layer 34 increases, and the potential change in graphene layer 34 also increases, with respect to the wavelength region of the electromagnetic wave that causes photoelectric conversion to occur in the silicon substrate which is substrate 10. Accordingly, the differential current which is the change in electrical quantity associated with the optical gate effect generated in graphene layer 40 also increases, so that the electromagnetic wave can be detected with higher sensitivity than in Embodiment 1 and Embodiment 6, with respect to the wavelength region of the electromagnetic wave that causes photoelectric conversion to occur in the silicon substrate which is substrate 10.

Figure 17:
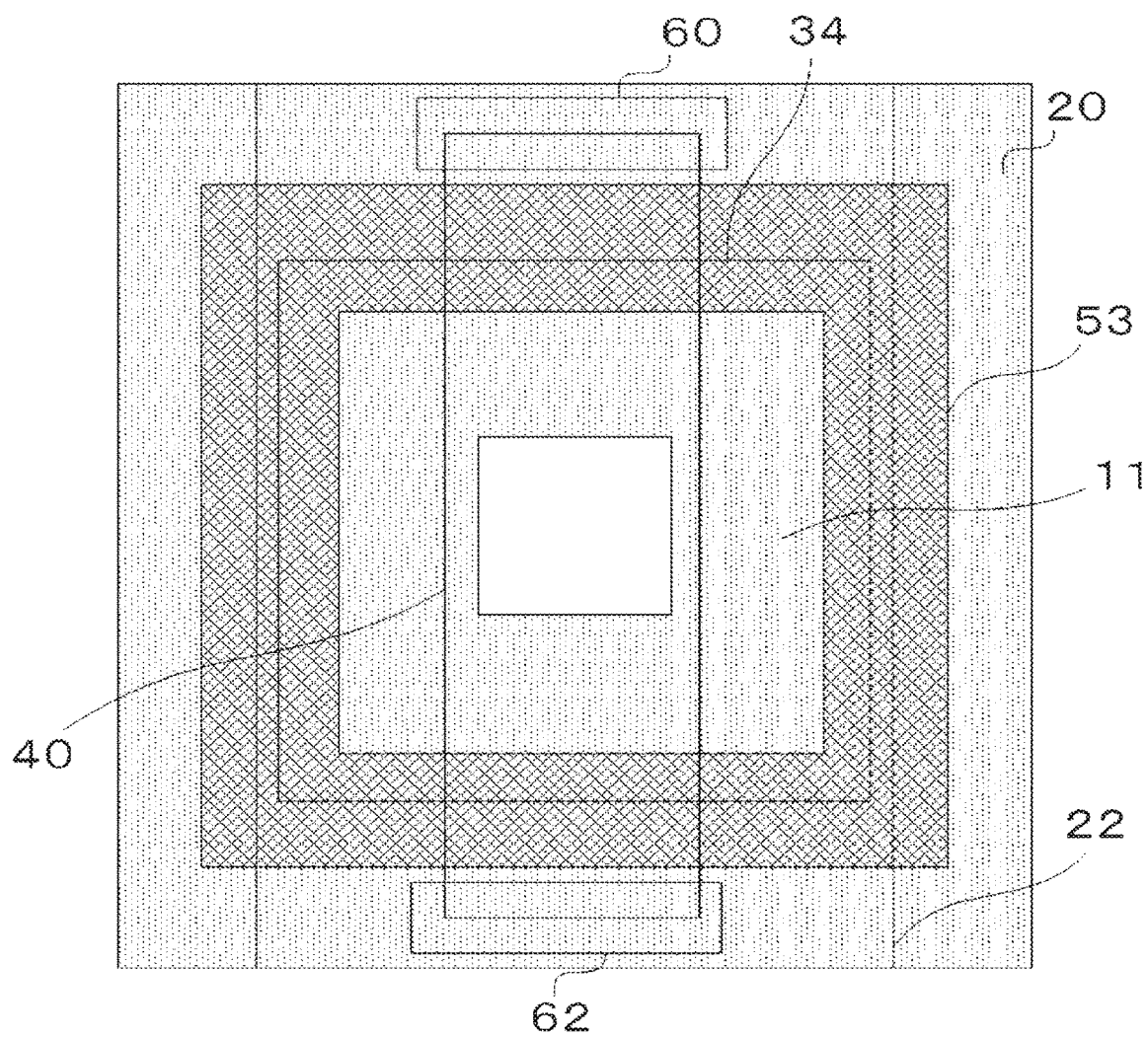
FIG. 17 is a plan view showing another configuration of the electromagnetic wave detector in Embodiment 8 of the present invention.

While an example using drain electrode 50 and source electrode 52 has been described in the present embodiment, for example, as shown in FIG. 17, one electrode surrounding graphene layer 34 such as electrode 53 may be used instead of drain electrode 50 and source electrode 52, to implement operation just like a diode between the back gate electrode and electrode 53 connected to substrate 10. FIG. 17 is a plan view showing another configuration of the electromagnetic wave detector in the present embodiment, where hatching of graphene layer 34, insulating film 22 and graphene layer 40 provided above electrode 53 is omitted. The sectional structure of the another configuration of the electromagnetic wave detector in the present embodiment is similar to that of FIG. 16, and is thus omitted.

In the another configuration of the electromagnetic wave detector in the present embodiment as shown in FIG. 17, by implementing the operation just like a diode between the back gate electrode and electrode 53 connected to substrate 10, an effect similar to that of the present embodiment is provided. In addition, since the bias voltage is not applied between drain electrode 50 and source electrode 52 as in the present embodiment, the dark current can be suppressed, so that a sensitive electromagnetic wave detector with reduced noise can be provided.

While substrate 10 has been described as a silicon substrate by way of example in the present embodiment, substrate 10 may be, instead of the silicon substrate, a substrate containing germanium, a compound semiconductor such as a III-V group or II-V group semiconductor, mercury cadmium telluride, indium antimony, lead selenium, lead sulfur, cadmium sulfur, gallium nitrogen, silicon carbide, or a quantum well or a quantum dot, or a substrate containing a material such as a Type II superlattice alone or in combination. In the case of indium antimony, for example, the above-described operation is possible in the infrared wavelength region, so that an electromagnetic wave detector more sensitive in the infrared wavelength region can be implemented. In addition, a specific wavelength can be detected with higher sensitivity by changing the material for substrate 10.

While an example using insulating layer 22 has been described in the present embodiment, an effect similar to that described above can also be obtained when insulating film 22 is a layer entirely or partially formed of a semiconductor layer as illustrated in substrate 10 or of a combination of the semiconductor layer and an insulating layer, and these layers are in contact with a part of graphene layer 34 or graphene layer 40.

The configuration of the electromagnetic wave detector in the present embodiment is also applicable to the other embodiments.

Embodiment 9

In an electromagnetic wave detector in Embodiment 9 of the present invention, unlike Embodiment 2, insulating film 20 is provided with an opening 12 at which substrate 10 is exposed, and a graphene layer 49 and substrate 10 are in contact with each other. The parts designated by the same reference signs are configured similarly to those of the electromagnetic wave detector in Embodiment 1, and thus descriptions are omitted.

Figure 18:
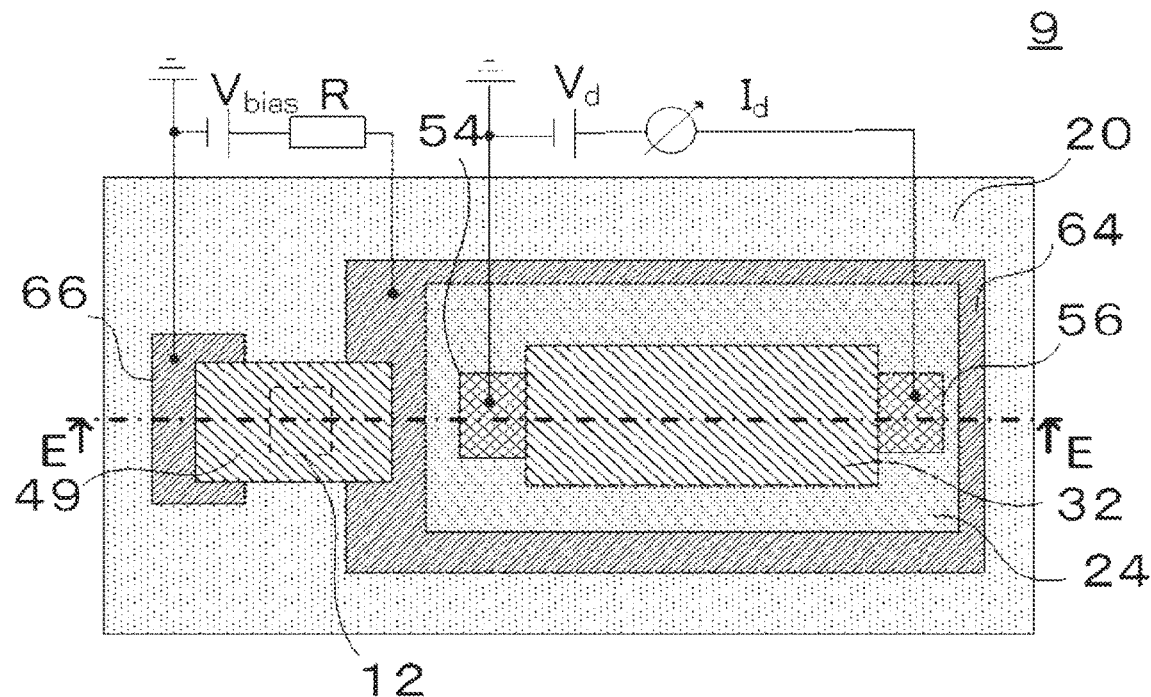
FIG. 18 is a plan view showing the configuration of an electromagnetic wave detector in Embodiment 9 of the present invention.
Figure 19:
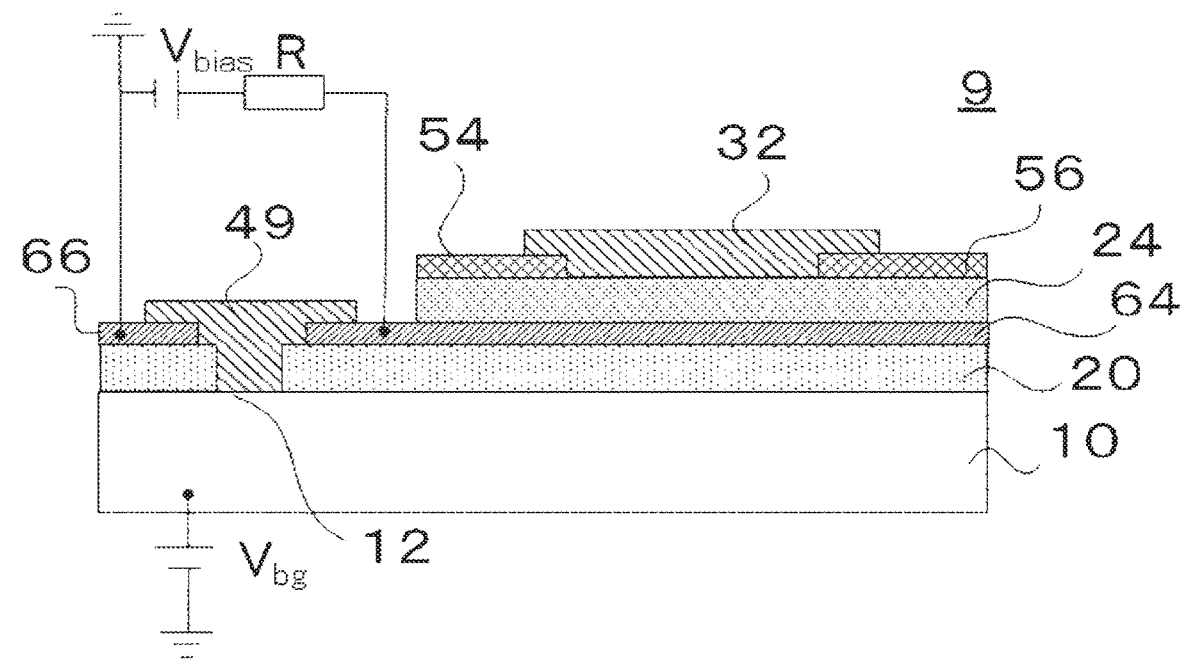
FIG. 19 is a sectional view showing the configuration of the electromagnetic wave detector in Embodiment 9 of the present invention.

FIG. 18 is a plan view showing the configuration of the electromagnetic wave detector in the present embodiment. FIG. 19 is a sectional view showing the configuration of the electromagnetic wave detector in the present embodiment, as seen along the section line E-E in FIG. 18.

As shown in FIGS. 18 and 19, in an electromagnetic wave detector 9 in the present embodiment, insulating film 20 is provided with opening 12 at which substrate 10 is exposed, and graphene layer 49 and substrate 10 are in contact with each other. Specifically, as shown in FIG. 18, opening 12 having an oblong shape in plan view is provided in insulating film 20 below graphene layer 49, and substrate 10 is exposed at insulating film 20 by this opening 12. Graphene layer 49 is provided in this opening 12, and graphene layer 49 and substrate 10 are in contact with each other in a partial region. Unlike Embodiment 2, back gate voltage $V_{bg}$ is applied to substrate 10.

The shape of opening 12 in plan view is not limited to the oblong shape. Any shape may be used so long as graphene layer 49 and substrate 10 are in contact with each other, such as a rectangular shape, a circular shape, an elliptical shape or other polygonal shapes.

The operating principle of electromagnetic wave detector 9 in the present embodiment is now described, with reference to an example where substrate 10 is a silicon substrate.

When light of a visible wavelength, for example, which causes a silicon substrate to perform photoelectric conversion, is incident on the silicon substrate which is substrate 10, for example, photoelectric conversion occurs in the silicon substrate, to generate carries in the silicon substrate.

With back gate voltage $V_{bg}$ being applied to the silicon substrate which is substrate 10, charge of one of the carriers, that is, electrons and holes, generated by the photoelectric conversion in the silicon substrate is attracted toward graphene layer 49 and injected into graphene layer 49.

With bias voltage $V_{bg}$ being applied between drain electrode 50 and source electrode 52, the charge injected into graphene layer 49 is extracted at electrode 64 or electrode 66, causing a current to flow in graphene layer 49. That is, potential change occurs in graphene layer 49, with respect to the wavelength region of the electromagnetic wave that causes photoelectric conversion to occur in the silicon substrate which is substrate 10.

As a result of this potential change in graphene layer 49, graphene layer 32 generates a differential current which is change in electrical quantity associated with the optical gate effect described above. By detecting this differential current, electromagnetic wave detector 9 in the present embodiment can detect the electromagnetic wave, with respect to the wavelength region of the electromagnetic wave that causes photoelectric conversion to occur in the silicon substrate which is substrate 10.

Here, since the mobility of graphene in graphene layer 49 is higher than the life of the carriers injected into graphene layer 49, the carriers injected into graphene layer 49 can be extracted at electrode 64 or electrode 66, in addition to the carriers generated by the photoelectric conversion in graphene layer 49, and the current flowing in graphene layer 49 increases, and the potential change in graphene layer 49 also increases, with respect to the wavelength region of the electromagnetic wave that causes photoelectric conversion to occur in the silicon substrate which is substrate 10. Accordingly, the differential current which is the change in electrical quantity associated with the optical gate effect generated in graphene layer 32 also increases, so that the electromagnetic wave can be detected with higher sensitivity than in Embodiment 2, with respect to the wavelength region of the electromagnetic wave that causes photoelectric conversion to occur in the silicon substrate which is substrate 10.

While substrate 10 has been described as a silicon substrate by way of example in the present embodiment, substrate 10 may be, instead of the silicon substrate, a substrate containing germanium, a compound semiconductor such as a III-V group or II-V group semiconductor, mercury cadmium telluride, indium antimony, lead selenium, lead sulfur, cadmium sulfur, gallium nitrogen, silicon carbide, or a quantum well or a quantum dot, or a substrate containing a material such as a Type II superlattice alone or in combination. In the case of indium antimony, for example, the above-described operation is possible in the infrared wavelength region, so that an electromagnetic wave detector more sensitive in the infrared wavelength region can be implemented. In addition, a specific wavelength can be detected with higher sensitivity by changing the material for substrate 10.

While an example using insulating layer 24 has been described in the present embodiment, an effect similar to that described above can also be obtained when insulating film 24 is a layer entirely or partially formed of a semiconductor layer as illustrated in substrate 10 or of a combination of the semiconductor layer and an insulating layer, and these layers are in contact with a part of graphene layer 32.

The configuration of the electromagnetic wave detector in the present embodiment is also applicable to the other embodiments.

Embodiment 10

Figure 20:
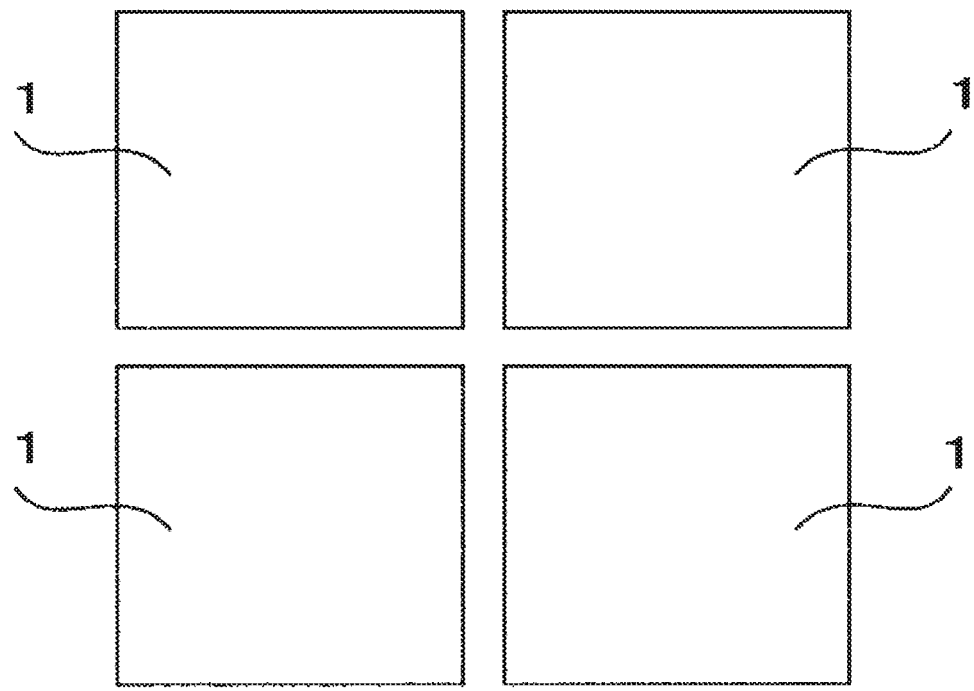
FIG. 20 is a plan view showing the configuration of an electromagnetic wave detector array in Embodiment 10 of the present invention.

An electromagnetic wave detector array in Embodiment 10 of the present invention has a plurality of electromagnetic wave detectors, which are arranged in an array in a one-dimensional direction or a two-dimensional direction. FIG. 20 is a plan view showing the configuration of the electromagnetic wave detector array in the present embodiment.

As shown in FIG. 20, an electromagnetic wave detector array 100 in the present embodiment has a plurality of electromagnetic wave detectors 1 described in Embodiment 1, which are arranged in an array in a two-dimensional direction. In the present embodiment, electromagnetic wave detectors 1 described in Embodiment 1 are arranged in a 2×2 array. However, the number of electromagnetic wave detectors 1 arranged is not limited thereto. While they are periodically arranged two-dimensionally in the present embodiment, they may be periodically arranged one-dimensionally. Alternatively, they may be arranged at varying intervals rather than periodically.

In this manner, electromagnetic wave detector array 100 using graphene can detect electromagnetic waves in a very broad wavelength range from ultraviolet light to microwaves. In particular, the electromagnetic wave detector array can also be used as an image sensor by the arrayed arrangement. For example, when applied to a vehicle-mounted sensor, electromagnetic wave detector array 100 can be used as a visible light image camera in the daytime and as an infrared camera in the nighttime, without the need to use different cameras having image sensors depending on the detection wavelength of an electromagnetic wave.

Note that a read circuit for reading electric signals obtained from respective electromagnetic wave detectors 1, a matrix selection circuit and the like are preferably disposed outside electromagnetic wave detector array 100.

As stated above, the electromagnetic wave detector array in the present embodiment configured as described above can detect electromagnetic waves in a broad wavelength region, to provide a sensitive electromagnetic wave detector array having high response speed to electromagnetic waves.

While electromagnetic wave detector array 100 having the plurality of electromagnetic wave detectors 1 described in Embodiment 1 has been described by way of example in the present embodiment, the electromagnetic wave detectors described in the other embodiments may be used instead of electromagnetic wave detectors 1 described in Embodiment 1.

Embodiment 11

Figure 21:
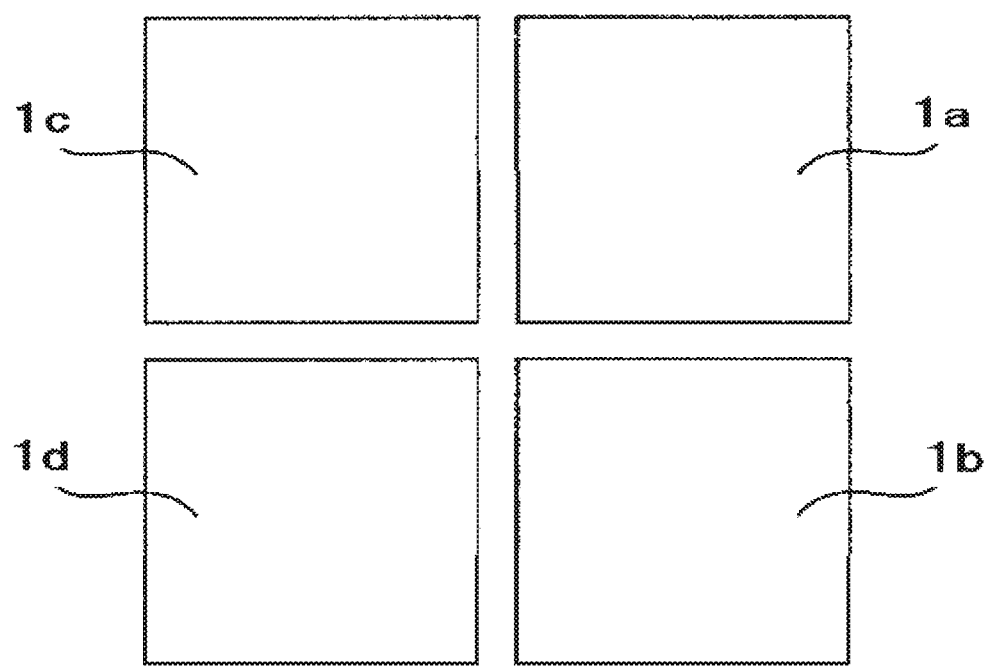
FIG. 21 is a plan view showing the configuration of an electromagnetic wave detector array in Embodiment 11 of the present invention.

An electromagnetic wave detector array in Embodiment 11 of the present invention has, unlike Embodiment 10, a plurality of electromagnetic wave detectors of different types from one another, which are arranged in an array in a one-dimensional direction or a two-dimensional direction. FIG. 21 is a plan view showing the configuration of the electromagnetic wave detector array in the present embodiment.

As shown in FIG. 21, an electromagnetic wave detector array 200 in the present embodiment has electromagnetic wave detectors 1a, 1b, 1c and 1d of different types from one another, which are arranged in a 2×2 matrix. However, the number of electromagnetic wave detectors arranged is not limited thereto. While they are periodically arranged two-dimensionally in the present embodiment, they may be periodically arranged one-dimensionally. Alternatively, they may be arranged at varying intervals rather than periodically.

By the arrangement of the different types of electromagnetic wave detectors described in Embodiments 1 to 9 in a one-dimensional or two-dimensional array, electromagnetic wave detector array 200 in the present embodiment can have the function of an image sensor.

In electromagnetic wave detector array 200 in the present embodiment, for example, electromagnetic wave detectors 1a, 1b, 1c and 1d may be formed of electromagnetic wave detectors having detection wavelengths different from one another. Specifically, the electromagnetic wave detectors having selectivity for detection wavelength described in Embodiments 1 to 9 are arranged in an array. Electromagnetic wave detector array 200 can thereby detect electromagnetic waves of at least two or more different wavelengths.

By arranging the electromagnetic wave detectors having different detection wavelengths in an array in this manner, wavelengths can be discriminated also in the wavelength regions of ultraviolet light, infrared light, terahertz waves and radio waves to provide a colored image, in a manner similar to an image sensor used in the visible light range.

In an application other than the image sensor, the electromagnetic wave detector array can be used, even with a small number of pixels, as a sensor for detecting the position of an object. By the structure of electromagnetic wave detector array 200, an image sensor for detecting the intensities of electromagnetic waves of a plurality of wavelengths is obtained. Accordingly, electromagnetic waves of a plurality of wavelengths can be detected to provide a color image, without using a color filter conventionally required for a CMOS image sensor and the like.

Furthermore, a polarization discrimination image sensor can be formed by arraying electromagnetic wave detectors that detect different polarized lights. For example, polarization imaging is made possible by arranging a plurality of detectors in units of four pixels that detect polarization angles of 0°, 90°, 45° and 135°, respectively. A polarization discrimination image sensor is able to, for example, discriminate between artifacts and natural objects, discriminate between materials, discriminate between objects at the same temperature in the infrared wavelength region, identify a boundary between objects, improve an equivalent resolution, or the like.

As stated above, the electromagnetic wave detector array in the present embodiment configured as described above can detect electromagnetic waves in a broad wavelength region, to provide a sensitive electromagnetic wave detector array having high response speed to electromagnetic waves, as in Embodiment 8. In addition, the electromagnetic wave detector array in the present embodiment can provide an electromagnetic wave detector array capable of detecting electromagnetic waves of different wavelengths.

As described above, it has been mentioned in the embodiments of the present invention that the present invention is also applicable to an electromagnetic wave detector made of a two-dimensional atomic layer material such as graphene nanoribbon, transition metal dichalcogenide such as $MoS_2$, $WS_2$, $WSe_2$, black phosphorus, silicene, or germanene, other than graphene. The two-dimensional atomic layer material such as transition metal dichalcogenide or black phosphorus has a specific bandgap, and therefore has a substantially zero off current, so that the noise of the electromagnetic wave detector can be reduced.

The magnitude of a band gap of a layer made of the two-dimensional atomic layer material such as transition metal dichalcogenide or black phosphorus can be adjusted by adjusting the number of laminated layers. Thus, the wavelength of an electromagnetic wave to be detected can be selected by the number of laminated layers. For example, the transition metal dichalcogenide such as $MoS_2$, $WS_2$ has a band gap corresponding to the visible light wavelength, and black phosphorus has a band gap corresponding to the mid-infrared region. Accordingly, a wavelength-selective electromagnetic wave detector for detecting only an electromagnetic wave of a specific wavelength can be obtained. Since there is no need to control the band gap by the composition of a semiconductor material as in a conventional electromagnetic wave detector using a semiconductor, manufacturing steps are simplified. Since there is also no need to use an optical filter which is a typical wavelength selection method, the number of optical components can be reduced, and loss of incident light due to passage through the filter can also be reduced.

When the two-dimensional atomic layer material such as transition metal dichalcogenide or black phosphorus is used, polarization dependence of electromagnetic waves can be obtained by employing a laminated structure formed of a plurality of layers, and furthermore, by controlling a direction of lamination. Accordingly, an electromagnetic wave detector for selectively detecting only specific polarized light of an electromagnetic wave can be obtained.

Furthermore, by combining two or more different types of two-dimensional atomic layer materials from these two-dimensional atomic layer materials such as transition metal dichalcogenide and black phosphorus, or by combining the two-dimensional atomic layer materials such as transition metal dichalcogenide or black phosphorus with graphene, to form a hetero junction, the same effect as a quantum well effect or a tunnel effect in conventional semiconductor materials can be achieved between the different types of materials. The result is that noise can be reduced and recombination can be reduced, so that the sensitivity of the electromagnetic wave detector can be enhanced. In the infrared wavelength region where thermal noise is dominant, reduction in thermal noise by utilizing the tunnel effect has a significant effect. Normal temperature operation is also made possible.

Note that in the present invention, the respective embodiments can be combined in any manner, or the respective embodiments can be appropriately modified, omitted, and so on, within the scope of the invention. Furthermore, the present invention is not limited to the embodiments described above, but can be modified in various ways at a stage of implementation within the scope not departing from the gist of the invention. In addition, various stages of the invention are included in the embodiments described above, and various inventions can be extracted by appropriate combinations in a plurality of constituent features disclosed.

REFERENCE SIGNS LIST 20, 22, 24 insulating film; 30, 32, 40, 42, 44, 46, 48 graphene layer; 50, 56, 58 drain electrode; 52, 54, 59 source electrode; 60, 62, 64, 66, 68, 69 electrode.

The invention claimed is:

1. An electromagnetic wave detector comprising:
a first insulating film having a first surface and a second surface facing the first surface;
a first layer to perform photoelectric conversion by an incident electromagnetic wave and change in potential with a bias voltage applied to the first layer, the first layer being made of a first two-dimensional atomic layer material; and
a second layer to receive the change in potential through the first insulating film and generate change in electrical quantity, the second layer being made of a second two-dimensional atomic layer material and provided on the first surface,
the first insulating film having a thickness that prevents generation of a tunnel current between the first layer and the second layer in response to the incident electromagnetic wave.

2. The electromagnetic wave detector according to claim 1, comprising:
a substrate; and
a second insulating film provided on the substrate and contacting the second layer at a surface opposite to a surface on which the substrate is provided, wherein
the first layer is provided to contact the second surface of the first insulating film.

3. The electromagnetic wave detector according to claim 1, comprising:
a substrate; and
a second insulating film provided on the substrate and contacting the first layer at a surface opposite to a surface on which the substrate is provided, wherein
the first layer is provided to contact the second surface of the first insulating film, and partially extends through the second insulating film and contacts the substrate.

4. The electromagnetic wave detector according to claim 1, comprising:
a substrate;
a second insulating film provided on the substrate; and
a first electrode provided on a surface of the second insulating film opposite to a surface on which the substrate is provided, and provided to contact the second surface of the first insulating film, wherein
the first layer is provided on the surface of the second insulating film opposite to the surface on which the substrate is provided, is electrically connected to the first electrode, and provides the change in potential from the first electrode to the second layer through the first insulating film.

5. The electromagnetic wave detector according to claim 4, wherein
the first layer partially extends through the second insulating film and contacts the substrate.

6. The electromagnetic wave detector according to claim 2, comprising:
a second electrode electrically connected to one end of the second layer; and
a third electrode electrically connected to the other end of the second layer, wherein
the first layer is provided above the second layer between the second electrode and the third electrode, and disposed closer to third electrode than to the second electrode.

7. The electromagnetic wave detector according to claim 2, wherein
a plurality of the first layers are provided on the first insulating film and spaced apart in an in-plane direction of the substrate.

8. The electromagnetic wave detector according to claim 2, wherein
the first layer has a periodic structure that causes resonance of an incident electromagnetic wave.

9. The electromagnetic wave detector according to claim 2, comprising a fourth electrode which is electrically connected to the substrate and to which a back gate voltage is applied.

10. The electromagnetic wave detector according to claim 1, comprising:

a second electrode electrically connected to one end of the second layer; and a third electrode electrically connected to the other end of the second layer and having a metallic material different from a metallic material for the second electrode.

11. The electromagnetic wave detector according to claim 1, comprising:

a fourth electrode electrically connected to one end of the first layer; and a fifth electrode electrically connected to the other end of the first layer and having a metallic material different from a metallic material for the fourth electrode.

12. The electromagnetic wave detector according to claim 4, comprising a fourth electrode electrically connected to the first layer and having a metallic material different from a metallic material for the first electrode.

13. The electromagnetic wave detector according to claim 1, wherein the first two-dimensional atomic layer material includes a two-dimensional atomic layer material selected from the group consisting of graphene, graphene nanoribbon, transition metal dichalcogenide, black phosphorus, silicene, and germanene.

14. The electromagnetic wave detector according to claim 1, wherein the second two-dimensional atomic layer material includes a two-dimensional atomic layer material selected from the group consisting of graphene, graphene nanoribbon, transition metal dichalcogenide, black phosphorus, silicene, and germanene.

15. Al electromagnetic wave detector array comprising a plurality of the electromagnetic wave detectors according to claim 1, the plurality of electromagnetic wave detectors being arranged in an array in a one-dimensional direction or a two-dimensional direction.

16. The electromagnetic wave detector according to claim 1, wherein a constant voltage is applied to the second layer.

17. The electromagnetic wave detector according to claim 1, wherein the first insulating film comprises at least one selected from the group consisting of silicon oxide, silicon nitride, hafnium oxide, nickel oxide, and boron nitride.

* * * * *